(12) United States Patent
Wada

(10) Patent No.: US 12,119,249 B2
(45) Date of Patent: Oct. 15, 2024

(54) CONVEYANCE VEHICLE

(71) Applicant: MURATA MACHINERY, LTD., Kyoto (JP)

(72) Inventor: Eiji Wada, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 701 days.

(21) Appl. No.: 17/312,454

(22) PCT Filed: Nov. 20, 2019

(86) PCT No.: PCT/JP2019/045448
§ 371 (c)(1),
(2) Date: Jun. 10, 2021

(87) PCT Pub. No.: WO2020/121765
PCT Pub. Date: Jun. 18, 2020

(65) Prior Publication Data
US 2022/0059380 A1 Feb. 24, 2022

(30) Foreign Application Priority Data
Dec. 14, 2018 (JP) ................................. 2018-234468

(51) Int. Cl.
*H01L 21/677* (2006.01)
*B61B 3/00* (2006.01)
*H01L 21/67* (2006.01)

(52) U.S. Cl.
CPC .......... *H01L 21/67724* (2013.01); *B61B 3/00* (2013.01); *H01L 21/67259* (2013.01); *H01L 21/6773* (2013.01); *H01L 21/67733* (2013.01)

(58) Field of Classification Search
CPC .................... H01L 21/67724; H01L 21/67733
See application file for complete search history.

(56) References Cited

U.S. PATENT DOCUMENTS

| | | | |
|---|---|---|---|
| 9,263,311 B2* | 2/2016 | Ota ................... | H01L 21/67736 |
| 2013/0197691 A1* | 8/2013 | Tsubaki ............ | H01L 21/68707 |
| | | | 700/228 |
| 2020/0270102 A1* | 8/2020 | Wada ................ | H01L 21/67259 |

FOREIGN PATENT DOCUMENTS

WO 2017/199593 A1 11/2017

OTHER PUBLICATIONS

Official Communication issued in International Patent Application No. PCT/JP2019/045448, mailed on Feb. 10, 2020.
(Continued)

*Primary Examiner* — Timothy R Waggoner
(74) *Attorney, Agent, or Firm* — Keating & Bennett, LLP

(57) ABSTRACT

A conveyance vehicle includes a traveling driver, a main body, an up-and-down stage including a gripper to hold an article and capable of moving up and down with respect to the main body, an up-and-down driver to cause the up-and-down stage to move up and down by drawing out and winding up of belts, a lateral mover to cause the up-and-down driver while being cantilevered to protrude laterally of the main body, and an adjuster. In accordance with a laterally moved amount of the up-and-down driver by the lateral mover and a lowered amount of the up-and-down stage by the up-and-down driver, the adjuster performs one or both of adjustment of the laterally moved amount and adjustment of an orientation of a sensor included in the up-and-down driver to deliver the article to the transfer destination and to receive the article from the transfer destination.

6 Claims, 13 Drawing Sheets

(56) References Cited

OTHER PUBLICATIONS

Official Communication issued in corresponding European Patent Application No. 19896209.4, mailed on Jul. 12, 2022.

* cited by examiner

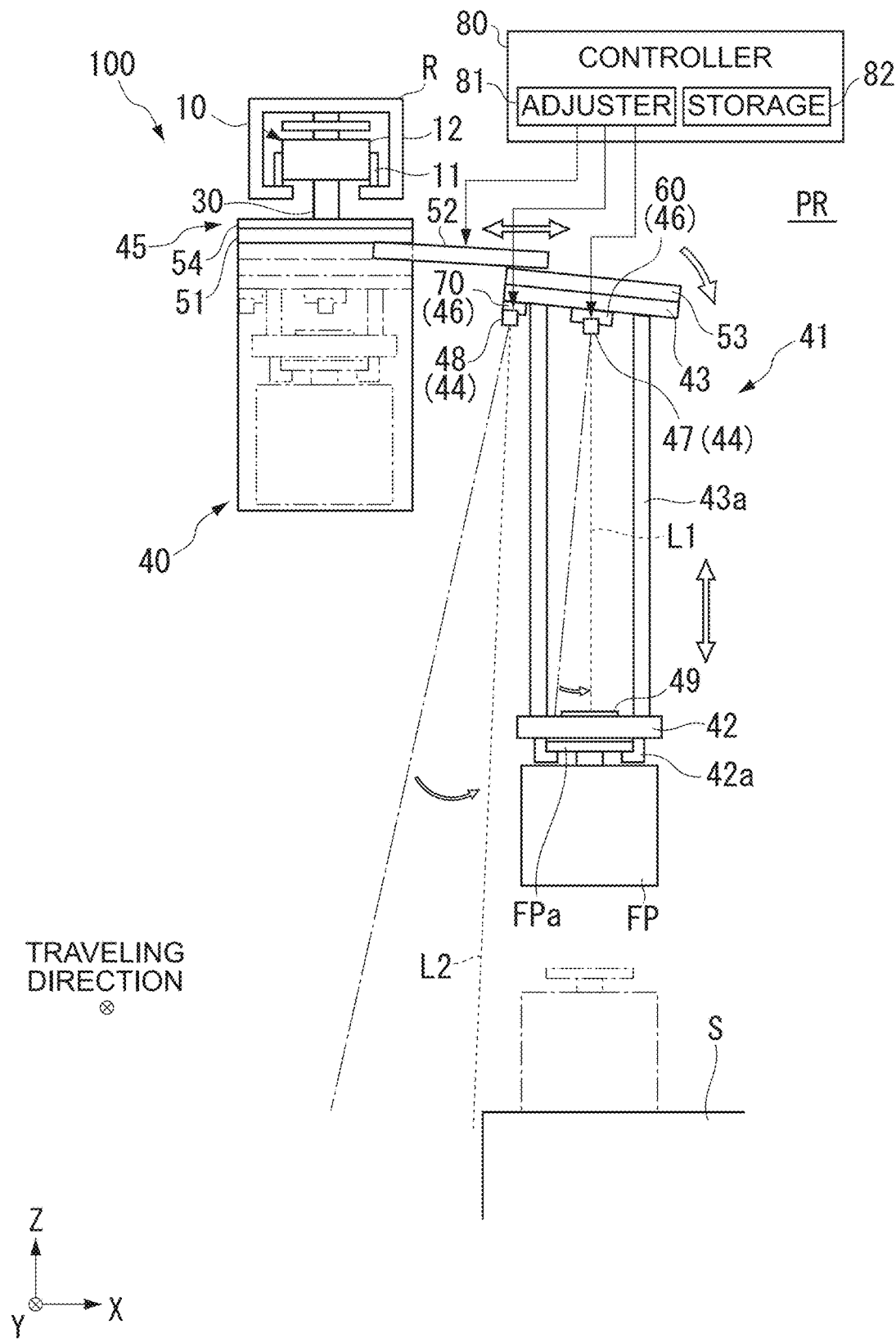
[FIG. 1]

[FIG. 2]
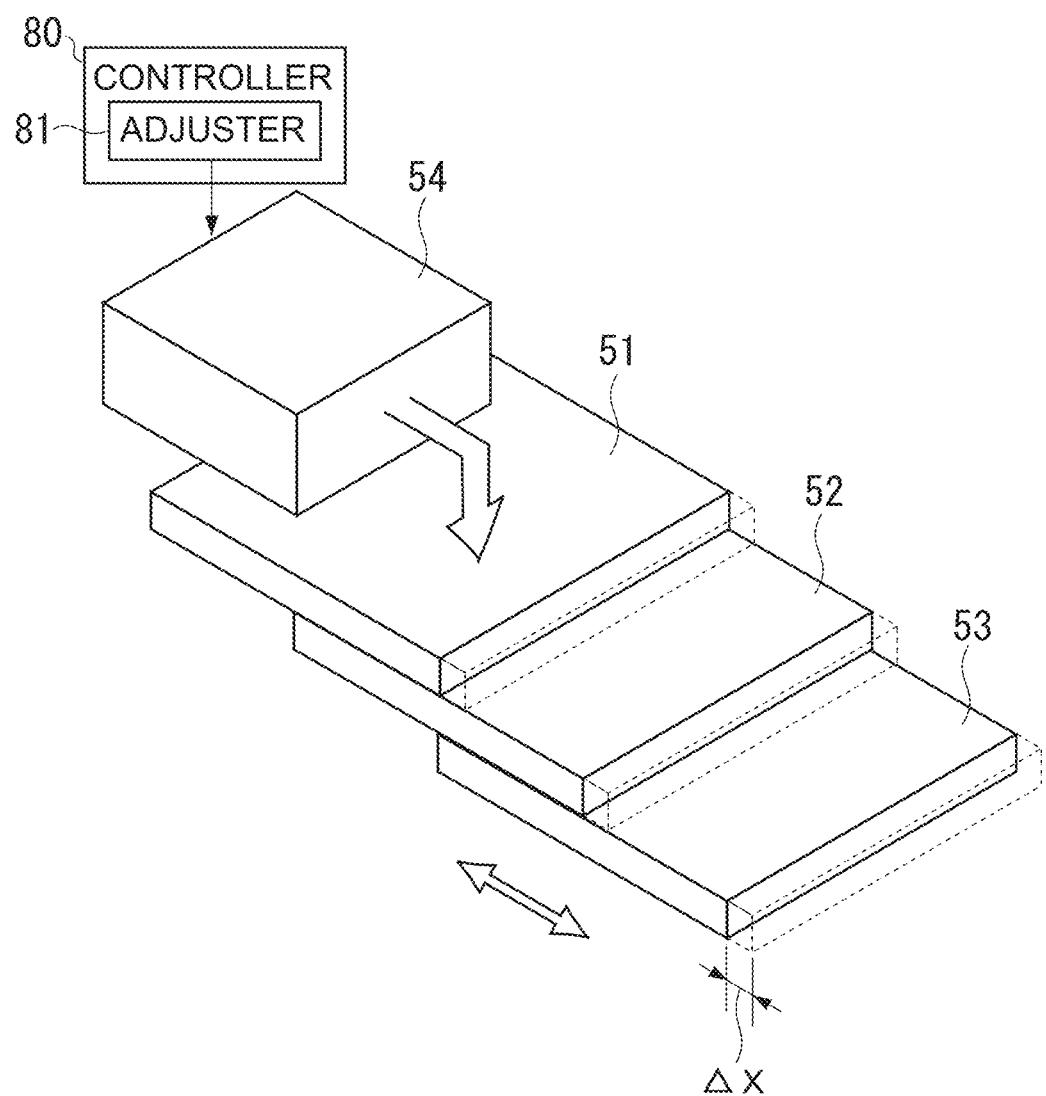

[FIG. 3]
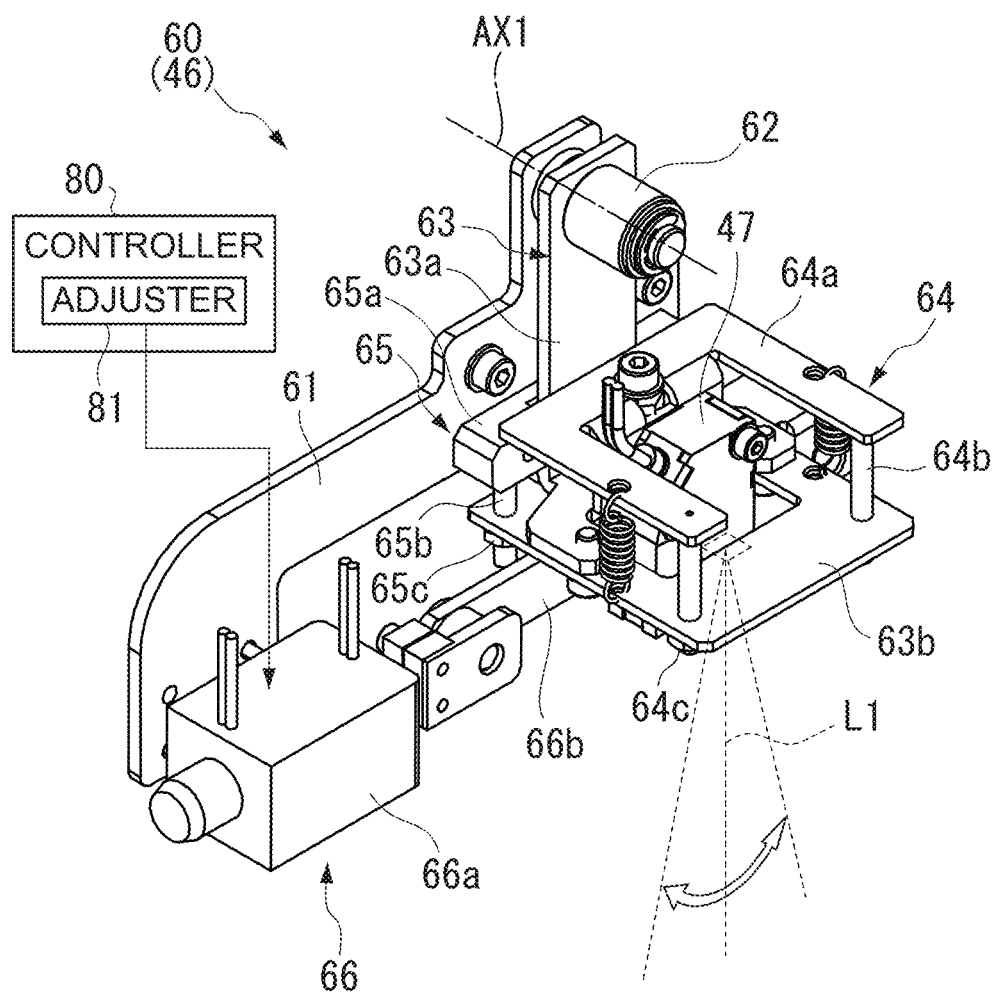

[FIG. 4]
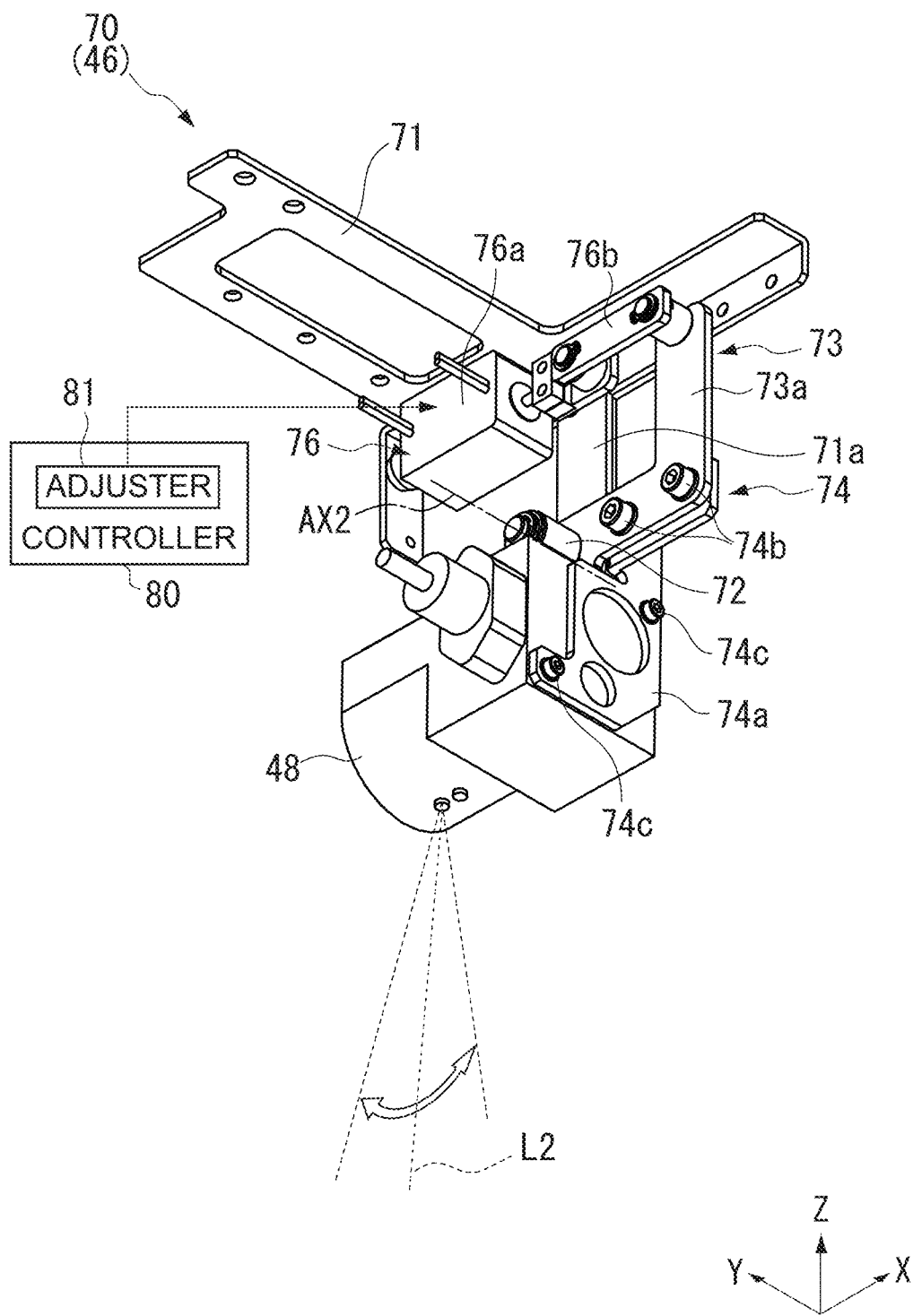

[FIG. 5]
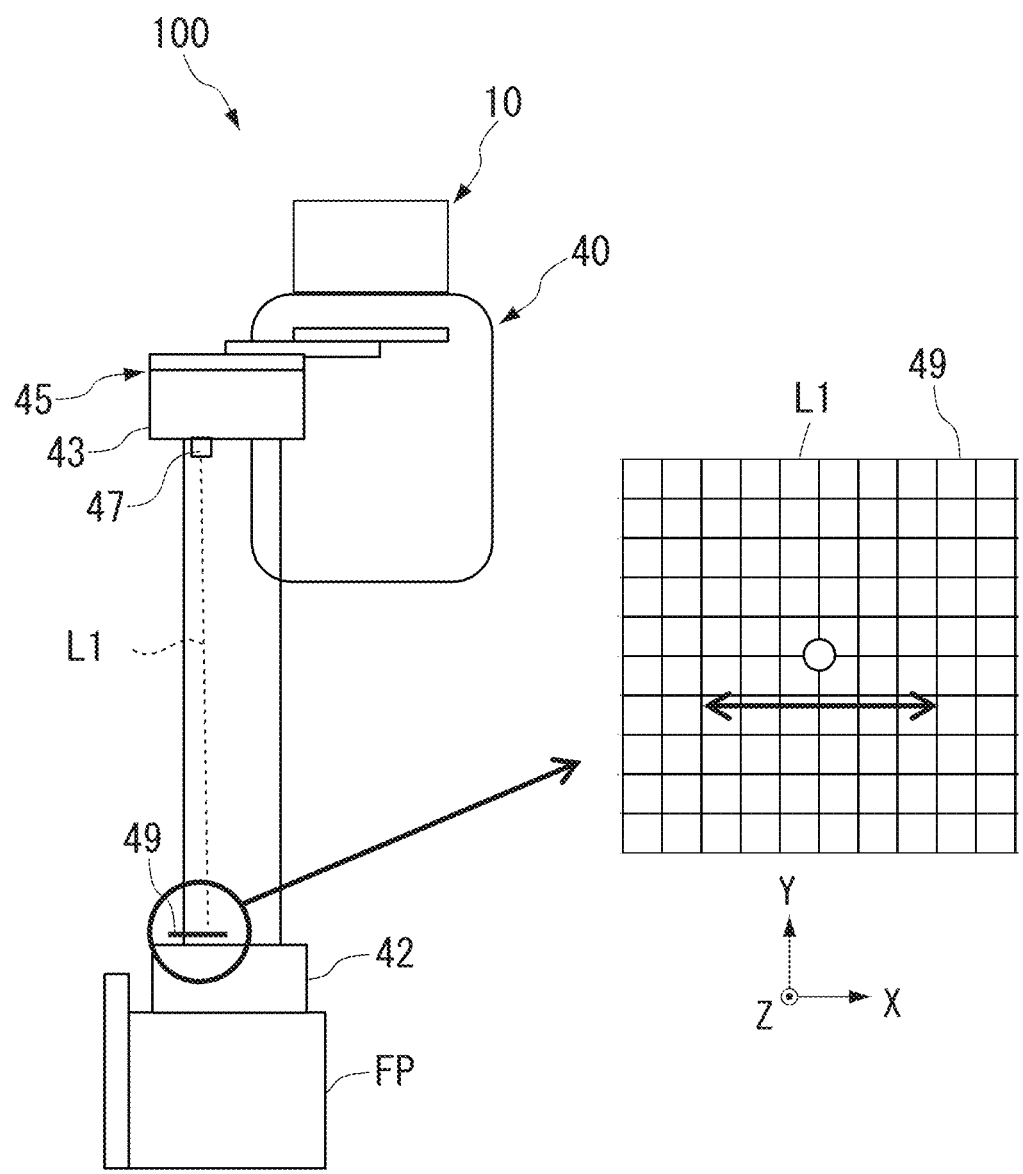

[FIG. 6]
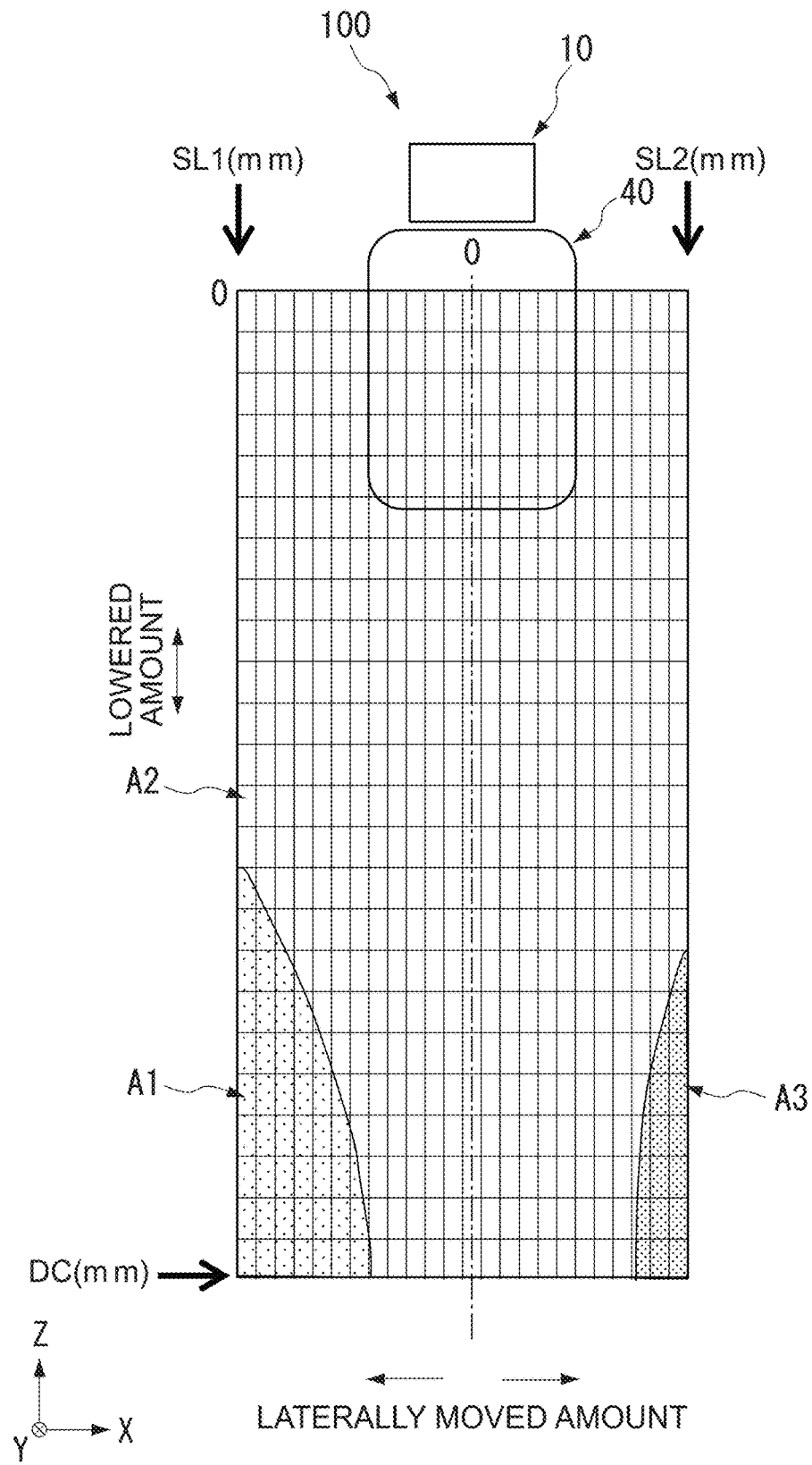

[FIG. 7]
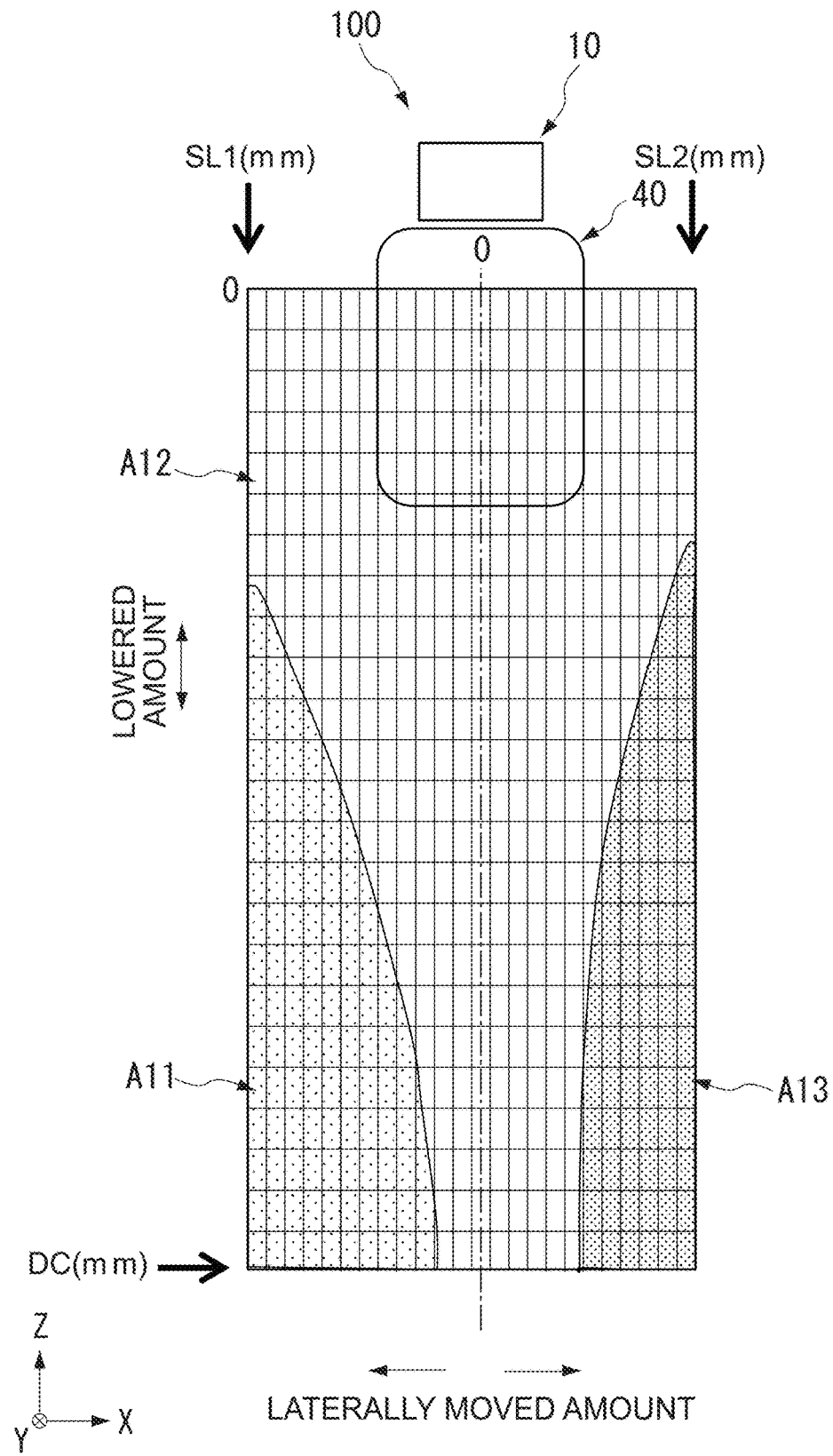

[FIG. 9]
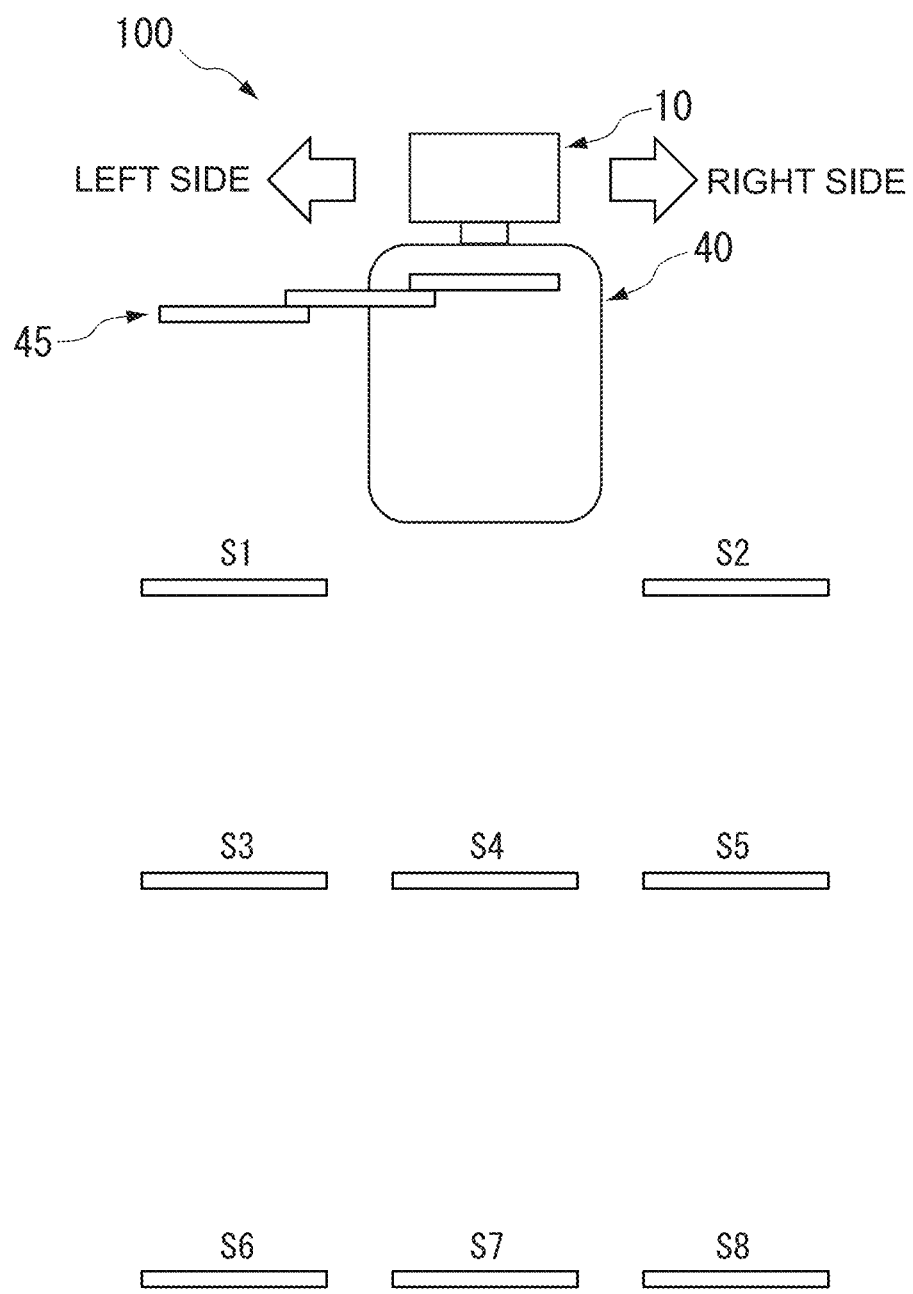

[FIG. 10]
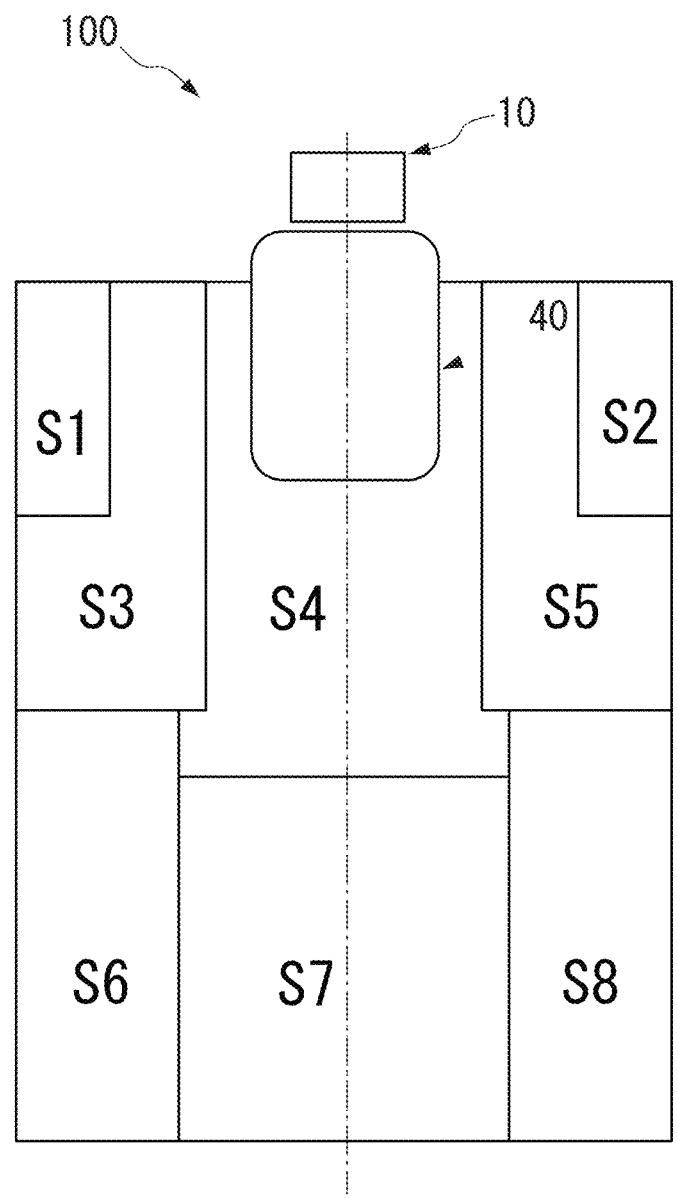

[FIG.11]

DATA TABLE DT1

| | TRANSFER DESTINATION | POSITION (COORDINATE VALUES) | LATERALLY MOVED AMOUNT | LOWERED AMOUNT |
|---|---|---|---|---|
| S1 | LEFT(STB) | X1,Y1,Z1 | SL1 | H1 |
| S2 | RIGHT(STB) | X2,Y1,Z1 | SL2 | H1 |
| S3 | LEFT HIGH PLACE | X1,Y2,Z2 | SLX1 | H2 |
| S4 | HIGH PLACE | X3,Y2,Z2 | 0 | H2 |
| S5 | RIGHT HIGH PLACE | X2,Y2,Z2 | SLX2 | H2 |
| S6 | LEFT LOW PLACE | X1,Y3,Z3 | SLX1 | H3 |
| S7 | LOW PLACE | X3,Y3,Z3 | 0 | H3 |
| S8 | RIGHT LOW PLACE | X2,Y3,Z3 | SLX2 | H3 |

[FIG.12]

DATA TABLE DT2

| | TRANSFER DESTINATION | ARTICLE | LATERAL MOVEMENT ADJUSTMENT AMOUNT | LOWERING ADJUSTMENT AMOUNT | SENSOR ACTUATOR |
|---|---|---|---|---|---|
| S1 | LEFT(STB) | PRESENT | SLL1 | H1A | OFF |
| | | ABSENT | SLL2 | H1B | OFF |
| S2 | RIGHT(STB) | PRESENT | SLR1 | H1C | OFF |
| | | ABSENT | SLR2 | H1D | OFF |
| S3 | LEFT HIGH PLACE | PRESENT | SLLX1 | H2A | ON(1) |
| | | ABSENT | SLLX2 | H2B | ON(1) |
| S4 | HIGH PLACE | PRESENT | ZERO | ZERO | OFF |
| | | ABSENT | ZERO | ZERO | OFF |
| S5 | RIGHT HIGH PLACE | PRESENT | SLRX1 | H2C | ON(2) |
| | | ABSENT | SLRX2 | H2D | ON(2) |
| S6 | LEFT LOW PLACE | PRESENT | SLLX1 | H3A | ON(1) |
| | | ABSENT | SLLX2 | H3B | ON(1) |
| S7 | LOW PLACE | PRESENT | ZERO | ZERO | OFF |
| | | ABSENT | ZERO | ZERO | OFF |
| S8 | RIGHT LOW PLACE | PRESENT | SLRX1 | H3C | ON(2) |
| | | ABSENT | SLRX1 | H3D | ON(2) |

[FIG. 13]
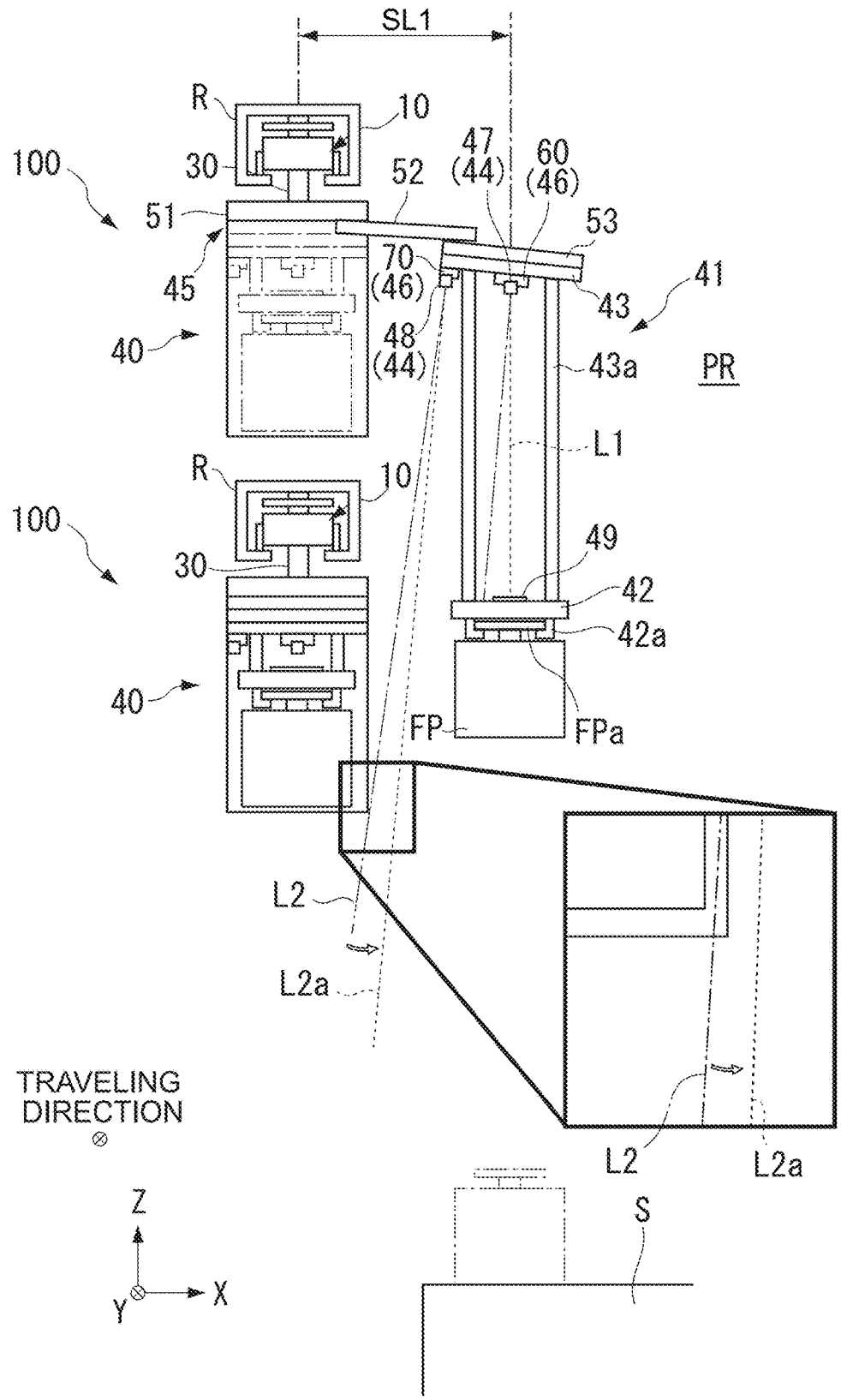

CONVEYANCE VEHICLE

BACKGROUND OF THE INVENTION

1. Field of the Invention

The present invention relates to a conveyance vehicle.

2. Description of the Related Art

In manufacturing factories such as semiconductor manufacturing factories, a conveyance vehicle traveling along a rail laid on the ceiling or near the ceiling is used in order to convey articles such as conveyance containers for semiconductor wafers, for example, front opening unified pods (FOUPs) and reticle pods for conveying reticles. The conveyance vehicle includes a traveler traveling along a track, a main body moving by the traveling of the traveler, an up-and-down stage capable of moving up and down with respect to the main body, and an up-and-down driver causing the up-and-down stage to move up and down and further includes a lateral mover causing the up-and-down driver to protrude laterally of a traveling direction with respect to the main body. This conveyance vehicle stops at a transfer position for an article provided within a factory and, depending on a transfer destination, performs reception and delivery of the article by the moving up and down of the up-and-down stage by the up-and-down driver and the grasping or releasing of the article by a holder included in the up-and-down stage with the up-and-down driver laterally moved by the lateral mover. In such a conveyance vehicle, it is considered that when lateral movement is performed by the lateral mover, bending caused by the weight of the up-and-down driver, the article, and the like occurs in the lateral mover, and that the article cannot be transferred to a prescribed transfer position due to this bending. Given these circumstances, a configuration is developed, when lateral movement is performed by the lateral mover, determining the magnitude of the bending in advance and adjusting the laterally moved amount based on this determined data (refer to Japanese Patent No. 5636849, for example).

As to the up-and-down driver, a conveyance vehicle including a sensor applying a detection wave downward in the up-and-down driver is known. The occurrence of bending when the up-and-down driver is laterally moved by the lateral mover as described above changes the direction in which the detection wave is applied. Thus, a conveyance vehicle is developed that changes the orientation of the sensor when the up-and-down driver is laterally moved by the lateral mover (refer to International Publication No. 2017/199593, for example).

SUMMARY OF THE INVENTION

In the conveyance vehicle described above, the magnitude of the bending occurring in the lateral mover changes depending on the laterally moved amount of the up-and-down driver by the lateral mover. The data determined in the conveyance vehicle described in Japanese Patent No. 5636849 is a fixed value set when the up-and-down driver is furthermost laterally moved by the lateral mover, for example. Thus, in the conveyance vehicle described in Japanese Patent No. 5636849, when the laterally moved amount of the up-and-down driver by the lateral mover changes, even with the laterally moved amount adjusted, the bending amount of the lateral mover changes, and thus if the article (the up-and-down stage) is lowered as it is, it deviates from a transfer position, and thus the article is not necessarily able to be accurately received from or delivered to a transfer destination.

The orientation of the sensor provided in the up-and-down driver also changes depending on the laterally moved amount of the up-and-down driver by the lateral mover. Furthermore, there is a problem in that when a lowered amount of the up-and-down stage increases with the orientation of the sensor changed, the detection wave deviates from a target application destination, that is to say, the detection wave from the sensor misses an indicator plate provided on the up-and-down stage, for example, and thus appropriate detection becomes unable to be performed.

Preferred embodiments of the present invention provide conveyance vehicles, each of which, when lateral movement is performed by a lateral mover, adjust a laterally moved amount or an orientation of a sensor to enable an article to be accurately received from or delivered to a transfer destination, or the sensor to be appropriately operated.

A conveyance vehicle according to an aspect of a preferred embodiment of the present invention includes a traveler to travel along a track, a main body coupled to the traveler to move by traveling of the traveler, an up-and-down stage including a holder to hold an article and capable of moving up and down with respect to the main body, an up-and-down driver to cause the up-and-down stage to move up and down by drawing out and winding up a flexible hanging-and-holding structure, a lateral mover to cause the up-and-down driver being cantilevered to protrude laterally of the main body, and an adjuster to perform adjustment, in accordance with a laterally moved amount of the up-and-down driver by the lateral mover and a lowered amount of the up-and-down stage by the up-and-down driver, of either one or both of the laterally moved amount and an orientation of a sensor included in the up-and-down driver, to deliver the article to a transfer destination or to receive the article from the transfer destination.

The sensor may apply a detection wave with directivity toward a certain lower position, and the adjuster may adjust the orientation of the sensor so as to correct deviation of an application direction of the detection wave. The sensor may include an actuator to change the application direction of the detection wave, and the adjuster may drive the actuator to correct the deviation of the application direction of the detection wave.

The main body may include a storage to store therein a data table of the laterally moved amount of the up-and-down driver by the lateral mover and the lowered amount to the transfer destination for each of a plurality of transfer destinations from and to which the article is received and delivered, and the adjuster may acquire information about the transfer destinations of the article from the data table stored in the storage and based on the information perform either one or both of the adjustment of the laterally moved amount and the adjustment of the orientation of the sensor included in the up-and-down driver. The storage may store therein, for each conveyance vehicle, its own unique machine difference in advance, and the adjuster may perform either one or both of the adjustment of the laterally moved amount and the adjustment of the orientation of the sensor included in the up-and-down driver including the machine difference stored in the storage.

When the laterally moved amount indicated by the data table is a first specific value, the adjuster may not perform the adjustment of the laterally moved amount and the adjustment of the orientation of the sensor included in the up-and-down driver, when the lowered amount indicated by the data table is less than a first threshold and perform either one or both of the adjustment of the laterally moved amount and the adjustment of the orientation of the sensor included in the up-and-down driver when the lowered amount indicated by the data table is the first threshold or more.

When the lowered amount indicated by the data table is a second specific value, the adjuster is configured to: not perform either the adjustment of the laterally moved amount or the adjustment of the orientation of the sensor included in the up-and-down driver when the laterally moved amount indicated by the data table is less than a second threshold, and perform either one or both of the adjustment of the laterally moved amount and the adjustment of the orientation of the sensor included in the up-and-down driver when the laterally moved amount indicated by the data table is the second threshold or more.

According to the conveyance vehicle, in accordance with the laterally moved amount of the up-and-down driver by the lateral mover and the lowered amount of the up-and-down stage by the up-and-down driver, adjustment of the laterally moved amount is performed to deliver the article to the transfer destination and to receive the article from the transfer destination, such that the article can accurately be received from and delivered to the transfer destination. In accordance with the laterally moved amount and the lowered amount of the up-and-down stage, adjustment of the orientation of the sensor included in the up-and-down driver is performed, such that the orientation of the sensor can be directed to a target direction, and false detection can be prevented while ensuring an appropriate operation of the sensor. Adjustment of the laterally moved amount is performed to deliver the article to the transfer destination and to receive the article from the transfer destination, and thus the article can accurately be received from and delivered to the transfer destination by considering the influence of bending by the weight of the article.

In the configuration in which the sensor applies a detection wave having directivity toward a certain lower position, and the adjuster adjusts the orientation of the sensor so as to correct deviation of an application direction of the detection wave, an orientation of the detection wave applied by the sensor can be adjusted with high precision. In the configuration in which the sensor includes an actuator to change the application direction of the detection wave, and the adjuster drives the actuator to correct the deviation of the application direction of the detection wave, the actuator is driven, such that the orientation of the detection wave can be adjusted with high precision.

In the configuration in which the main body includes a storage to store therein a data table about the laterally moved amount of the up-and-down driver by the lateral mover and the lowered amount to the transfer destination for each of a plurality of transfer destinations from and to which the article is received and delivered, and the adjuster acquires information on the transfer destinations of the article from the data table stored in the storage and performs either one or both of the adjustment of the laterally moved amount and the adjustment of the orientation of the sensor included in the up-and-down driver, the data table stored in the storage is read, such that the adjustment of the laterally moved amount and the adjustment of the orientation of the sensor can be performed quickly and with high precision. In the configuration in which the storage stores therein, for each conveyance vehicle, its own unique machine difference in advance, and the adjuster performs either one or both of the adjustment of the laterally moved amount and the adjustment of the orientation of the sensor included in the up-and-down driver including the machine difference stored in the storage, the adjustment of the laterally moved amount and the adjustment of the orientation of the sensor are performed considering the influence of the machine difference occurring in each conveyance vehicle, and thus the article can accurately be received from and delivered to the transfer destination by each conveyance vehicle.

In the configuration in which the adjuster, when the laterally moved amount indicated by the data table is a first specific value, does not perform either the adjustment of the laterally moved amount or the adjustment of the orientation of the sensor included in the up-and-down driver when the lowered amount indicated by the data table is less than a first threshold, and performs either one or both of the adjustment of the laterally moved amount and the adjustment of the orientation of the sensor included in the up-and-down driver when the lowered amount indicated by the data table is the first threshold or more, it is possible to switch whether or not to perform the adjustment in accordance with the lowered amount.

In the configuration in which the adjuster, when the lowered amount indicated by the data table is a second specific value, does not perform either the adjustment of the laterally moved amount or the adjustment of the orientation of the sensor included in the up-and-down driver when the laterally moved amount indicated by the data table is less than a second threshold, and performs either one or both of the adjustment of the laterally moved amount and the adjustment of the orientation of the sensor included in the up-and-down driver when the laterally moved amount indicated by the data table is the second threshold or more, it is possible to switch whether or not to perform the adjustment in accordance with the laterally moved amount.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a diagram illustrating an example of a conveyance vehicle according to a preferred embodiment of the present invention.

FIG. 2 is a perspective view illustrating an example of a lateral mover.

FIG. 3 is a perspective view illustrating an example of a first corrector.

FIG. 4 is a perspective view illustrating an example of a second corrector.

FIG. 5 is diagram schematically illustrating an example of detection by a shaking detection sensor.

FIG. 6 is a diagram illustrating a relation between a position of an up-and-down stage and a change amount in an optical axis position when a holder is not holding an article.

FIG. 7 is a diagram illustrating a relation between the position of the up-and-down stage and the change amount in the optical axis position when the holder is holding the article.

FIG. 8A illustrates an example of a case in which the laterally moved amount is large; and FIG. 8B illustrates an example of a case in which the laterally moved amount is small.

FIG. 9 is a diagram illustrating an example of transfer destinations of the article.

FIG. 10 is a diagram illustrating an example in which the transfer destinations of the article are illustrated in FIG. 9 by areas.

FIG. 11 is a diagram illustrating an example of a data table about positions of the transfer destinations, the laterally moved amount, and a lowered amount.

FIG. 12 is a diagram illustrating an example of a data table about a lateral movement adjustment amount and adjustment of an orientation of a sensor.

FIG. 13 is a diagram illustrating another example of a conveyance vehicle according to a preferred embodiment of the present invention.

DETAILED DESCRIPTION OF THE PREFERRED EMBODIMENTS

Figure 8A:
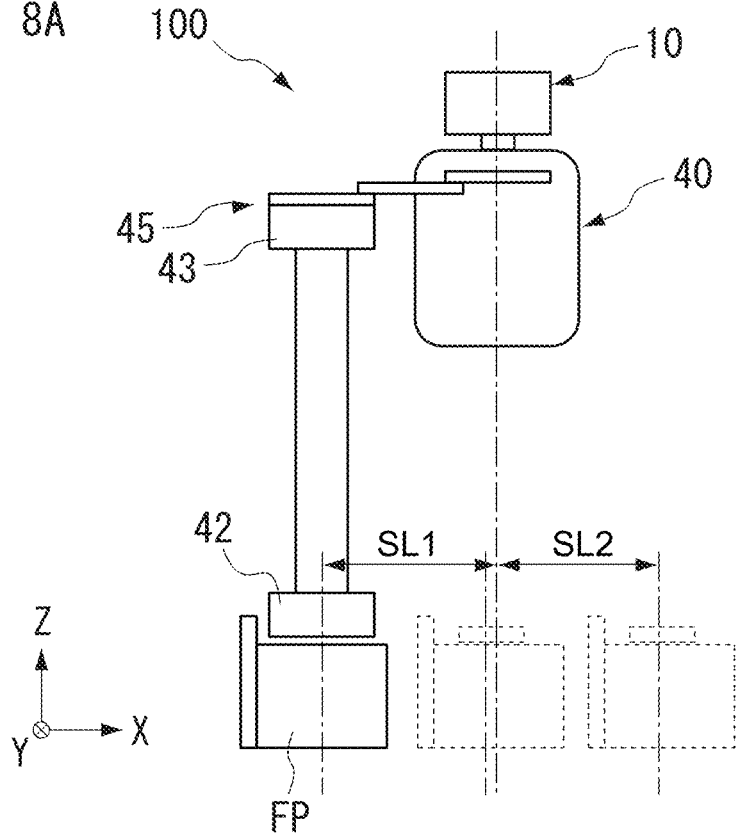
FIGS. 8A and 8B are diagrams illustrating a laterally moved amount of an up-and-down driver by the lateral mover when transfer of the article is performed.

The following describes preferred embodiments of the present invention with reference to the accompanying drawings. However, the present invention is not limited to the aspect described below. To describe the preferred embodiments, the drawings are represented with a scale changed as appropriate such as in a partially enlarged or emphasized manner. In the drawings below, directions in the drawings are described using an XYZ coordinate system. In this XYZ coordinate system, a plane parallel to a horizontal plane is defined as an XY plane. On this XY plane, a traveling direction of a conveyance vehicle 100 is denoted by a Y direction, whereas a horizontal direction orthogonal to the Y direction is denoted by an X direction. A direction perpendicular to the XY plane is denoted by a Z direction. Each of the X direction, the Y direction, and the Z direction is described with the direction indicated by the arrow in the drawings as a + direction and with the opposite direction as a − direction. A rotational direction around an X axis is denoted by a θX direction, a rotational direction around a Y axis is denoted by a θY direction, and a rotational direction around a Z axis is denoted by a θZ direction.

FIG. 1 is a diagram illustrating an example of a conveyance vehicle according to the present preferred embodiment. As illustrated in FIG. 1, a processing room PR such as a clean room is provided with a conveyance system including the conveyance vehicle 100. In the processing room PR, a semiconductor processing apparatus not illustrated and the like are located on the floor. On a ceiling of the processing room PR, a rail R as a track guiding the conveyance vehicle 100 is provided. The rail R includes a traveling rail and an electric supply rail.

The conveyance vehicle 100 travels in the +Y direction, for example, along the rail R. The conveyance vehicle 100 performs reception and delivery of an article FP from and to a transfer destination S. The transfer destination S is a load port of a processing apparatus, for example. As illustrated in FIG. 1, the conveyance vehicle 100 includes a traveling driver (traveler) 10, a coupler 30, a main body 40, and a controller 80. The driving of the portions of the conveyance vehicle 100 is controlled by the controller 80. Although the controller 80 is provided in the main body 40, for example, this configuration is not limiting; it may be provided outside the main body 40. The traveling driver 10 is located inside the rail R and includes a plurality of rollers 11 being in contact with an inside surface (a traveling surface) of the rail R and a drive apparatus 12 rotating these rollers 11. The conveyance vehicle 100 includes an electricity receiver not illustrated receiving electricity via a noncontact electricity supply line included in the electric supply rail not illustrated along the rail R and supplying electricity to a driver included in the conveyance vehicle 100 such as the traveling driver 10. The coupler 30 is mounted under (on the −Z side of) the traveling driver 10 to couple the traveling driver 10 and the main body 40 to each other.

The main body 40 includes a transfer apparatus 41. The transfer apparatus 41 includes an up-and-down stage 42, an up-and-down driver 43, a sensor 44, a lateral mover 45, and a corrector 46. The main body 40 is coupled to the traveling driver 10 via the coupler 30. The main body 40 moves along the rail R integrally with the traveling driver 10.

The up-and-down stage 42 can move up and down (can move in the Z direction) with respect to the main body 40. The up-and-down stage 42 includes a gripper 42a defining and functioning as a holder to hold the article FP. The article FP is a front opening unified pod (FOUP) housing semiconductor wafers or a reticle pod housing reticles, for example. The gripper 42a can grasp or release a flange FPa provided on the top (a surface on the +Z side) of the article FP.

The up-and-down driver 43 causes the up-and-down stage 42 to move up and down (move in the Z direction). The up-and-down driver 43 hangs the up-and-down stage 42 via a plurality of (four, for example) belts (hanging-and-holding members) 43a having flexibility, for example. The up-and-down driver 43 performs drawing out or winding up of the belts 43a to cause the up-and-down stage 42 to move up and down.

The sensor 44 is provided in the up-and-down driver 43. The sensor 44 includes a shaking detection sensor (a swing sensor) 47 and a look-down sensor 48. The shaking detection sensor 47 and the look-down sensor 48 apply a detection wave having directivity such as laser light toward an area to be detected below the up-and-down driver 43. In the following, the present preferred embodiment describes a configuration in which the shaking detection sensor 47 and the look-down sensor 48 apply the laser light as the detection wave as an example. The shaking detection sensor 47 and the look-down sensor 48 may apply another detection wave having directivity such as an ultrasonic wave apart from the laser light.

The shaking detection sensor 47 emits laser light L1 toward a reflective plate 49 provided on an upper surface (a surface on the +Z side) of the up-and-down stage 42. The shaking detection sensor 47, when the up-and-down stage 42 is caused to move up and down, applies the laser light L1 to the reflective plate 49 and from reflected light thereof detects shaking of the up-and-down stage 42. The controller 80 determines that the shaking (an amplitude) is within a normal range while the laser light L1 from the shaking detection sensor 47 is hitting the reflective plate 49. On the other hand, the controller 80 determines that the shaking has deviated from the normal range (the amplitude has increased to exceed a permitted limit) if the laser light L1 misses the reflective plate 49, and stops the moving up and down of the up-and-down stage 42, for example. The look-down sensor 48 applies laser light L2 toward the vicinity of a lowering destination of the up-and-down stage 42. The look-down sensor 48 applies the laser light L2 and from reflected light thereof detects whether there is a foreign object near the transfer destination S being the lowering destination of the up-and-down stage 42. The look-down sensor 48 detects whether there is any object (obstacle) such as an operator in an area closer to a passage than to the transfer destination S, for example. When the look-down sensor 48 detects an object, the controller 80 stops the moving up and down of the up-and-down stage 42, for example.

FIG. 2 is a perspective view illustrating an example of the lateral mover 45. The lateral mover 45 causes the up-and-down driver 43 being cantilevered to protrude laterally of the main body 40 (the X direction). The lateral mover 45 includes an upper tier portion 51, a middle tier portion 52, a lower tier portion 53, and a drive apparatus 54. The upper tier portion 51 is provided on an upper side of the main body 40. The upper tier portion 51 may be fixed to the main body 40 or be movable in the +X direction or the −X direction as the side of the main body 40 by a guide not illustrated. The middle tier portion 52 is mounted under the upper tier portion 51. The middle tier portion 52 moves in the +X direction or the −X direction with respect to the upper tier portion 51 by a guide not illustrated. The lower tier portion 53 is mounted under the middle tier portion 52. The lower tier portion 53 moves in the +X direction or the −X direction with respect to the middle tier portion 52. The upper tier portion 51, the middle tier portion 52, and the lower tier portion 53 move by the drive apparatus 54.

The drive apparatus 54 performs a lateral movement operation by the control of the controller 80. For the drive apparatus 54, a linear motor or a rotary motor including a ball screw or the like is used, for example. Although FIG. 1 and FIG. 2 illustrate a case in which the upper tier portion 51, the middle tier portion 52, and the lower tier portion 53 each move toward the −X side with respect to the main body 40 as an example, this example is not limiting; they can each also move toward the +X side with respect to the main body 40. The upper tier portion 51, the middle tier portion 52, and the lower tier portion 53 are not limited to being plate-shaped as illustrated in the drawing, and a rod-shaped member or a frame with rod-shaped members combined may be used. The drive apparatus 54 causes the upper tier portion 51 and the like to laterally move in the +X direction or the −X direction by a preset laterally moved amount as per an instruction from the controller 80. The drive apparatus 54 defines and functions as a corrector to adjust the laterally moved amount in the +X direction or the −X direction.

As illustrated in FIG. 1, the up-and-down driver 43 is mounted on a lower surface of the lower tier portion 53. A turning driver not illustrated capable of turning the up-and-down driver 43 in the θZ direction with respect to the lower tier portion 53 may be provided. Alternatively, a turning driver not illustrated capable of turning the gripper 42*a* in the θZ direction with respect to the up-and-down stage 42 may be provided. The lateral mover 45, with the middle tier portion 52 and the lower tier portion 53 caused to protrude laterally (the −X side) of the main body 40, collectively bends downward by the weight of the middle tier portion 52 and the lower tier portion 53 and the weight of the up-and-down driver 43, the up-and-down stage 42, the article FP, and the like, causing a tip side of the lower tier portion 53 to be moved downward. At this moment, the up-and-down driver 43 is inclined in the θY direction by the inclination of the lower tier portion 53. However, the belts 43*a* have flexibility, and thus even when the up-and-down driver 43 is inclined in the θY direction, the up-and-down stage 42 is positioned vertically below the up-and-down driver 43.

The shaking detection sensor 47 and the look-down sensor (the sensor 44) apply the laser light L1 and laser light L2, respectively, in directions deviated from original application directions by the inclination of the up-and-down driver 43. The corrector 46, with the up-and-down driver 43 caused to protrude laterally of the main body 40 by the lateral mover 45, corrects the deviation of the application direction of the laser light L1 and laser light L2 caused by the bending of the lateral mover 45. The corrector 46 includes a first corrector 60 and a second corrector 70. The first corrector 60 corrects the deviation of the application direction of the laser light L1 for the shaking detection sensor 47. The second corrector 70 corrects the deviation of the application direction of the laser light L2 for the look-down sensor 48.

FIG. 3 is a perspective view illustrating an example of the first corrector 60. As illustrated in FIG. 3, the first corrector 60 includes a frame 61, a shaft 62, a movable portion 63, an inclination adjuster 64, a rotation regulator 65, and a first correction driver 66.

The frame 61 includes a metallic plate or the like and is fixed to the up-and-down driver 43 with bolts or the like. The shaft 62 protrudes from the frame 61. The shaft 62 has a central axis AX1 parallel or substantially parallel to the Y direction. The movable portion 63 is rotatable (oscillatable) in the θY direction around the shaft portion 62 with respect to the frame 61. The movable portion 63 includes a hanger 63*a* and a support 63*b*. The hanger 63*a* extends downward from the shaft 62 and is supported rotatably in the θY direction with respect to the central axis AX1 of the shaft 62. The support 63*b* is rotatable in the θY direction around the central axis AX1 integrally with the hanger 63*a*. The support 63*b* has an opening as illustrated in FIG. 3 and supports the shaking detection sensor 47 via a sensor attachment 64*a* described below.

The inclination adjuster 64 adjusts an inclination of the shaking detection sensor 47. The inclination adjuster 64 includes the sensor attachment 64*a*, screws 64*b*, and nuts 64*c*. The sensor attachment 64*a* fixes the shaking detection sensor 47 by a certain attachment. The sensor attachment 64*a* is a U-shaped structure when viewed in the Z direction.

The screws 64*b* are located on both sides in the X direction across the shaking detection sensor 47. In the present preferred embodiment, the screws 64*b* are positioned at both ends of the sensor attachment 64*a*. The screws 64*b* are threadedly coupled to taps in the support 63*b* and extend upward (in the +Z direction) from the support 63*b*, and tips thereof are in contact with a lower surface of the sensor attachment 64*a*. The nuts 64*c* are threadedly coupled to lower ends of the screws 64*b* on a lower surface of the support 63*b*. The two screws 64*b* are individually adjusted to individually adjust the spacing between the sensor attachment 64*a* and the support 63*b* to enable the inclination of the shaking detection sensor 47 in the θY direction (the application direction of the laser light L1) to be adjusted to be directed vertically downward (to the −Z direction).

The rotation regulator 65 regulates a rotational range of the movable portion 63 in the θY direction around the central axis AX1. The rotation regulator 65 includes a base portion 65*a*, screws 65*b*, and nuts 65*c*. The base portion 65*a* is fixed to the frame 61. As illustrated in FIG. 3, the screws 65*b* are located on both sides across the shaking detection sensor 47 in the X direction on the support 63*b*. The screws 65*b* extend through the support 63*b* and are held by the nuts 65*c* while protruding toward the base portion 65*a*. A protruding amount of the screws 65*b* can be adjusted by a threadedly coupled position with the nuts 65*c*. When the movable portion 63 rotates in the θY direction around the central axis AX1, tips of the screws 65*b* come into contact with the base portion 65*a* to regulate the rotational range of the movable portion 63. The positions of the tips of the screws 65*b* are set in advance in accordance with an angle of the up-and-down driver 43 inclining in the θY direction. The rotation regulator 65 performs positioning at three points (a position at which the screws 65*b* are in contact with the base portion 65*a* on the −X side, the middle, and a position at which the screws 65*b* are in contact with the base portion 65*a* on the +X side) and can thus cope with both-side movement (lateral movement in the −X direction or the lateral movement in the +X direction) of the lateral mover 45.

The first correction driver 66 imparts a driving force in the X direction to the movable portion 63. The first correction driver 66 includes an actuator 66a and a transmitter 66b. For the actuator 66a, a solenoid or the like is used, for example. The transmitter 66b transmits the driving force of the actuator 66a to the support 63b. The transmitter 66b may include an elastic member. The first correction driver 66 drives the support 63b such that the driving force in the X direction acts on the support 63b. Consequently, the movable portion 63 rotates in the θY direction around the central axis AX1 to change the posture of the shaking detection sensor 47, and the application direction of the laser light L1 applied from the shaking detection sensor 47 changes in accordance with a rotational position of the movable portion 63.

A protruding amount in the X direction by the lateral mover 45 changes by a position of the transfer destination S. In accordance with the protruding amount by the lateral mover 45, the inclination of the up-and-down driver 43 in the θY direction changes. Consequently, in the present preferred embodiment, when the up-and-down driver 43 is caused to protrude by the lateral mover 45, the controller 80 determines whether the application direction of the laser light L1 should be changed in accordance with the inclination of the up-and-down driver 43 in the θY direction. When the controller 80 determines that the application direction of the laser light L1 should be changed, the first correction driver 66 drives the support 63b by an adjuster 81 described below to rotate the movable portion 63 and to hold the movable portion 63 at a certain position by the rotation regulator 65 as described above, such that the application direction of the laser light L1 applied from the shaking detection sensor 47 can be set to be applied to the reflective plate 49 (refer to FIG. 1). The controller 80 can correct the application direction of the laser light L1 from the shaking detection sensor 47 in accordance with the inclination of the up-and-down driver 43 simply by two kinds of control, that is, the support 63b is driven or not driven by the first correction driver 66. When the first correction driver 66 does not drive the support 63b, the transmitter 66b is held at a certain position by an elastic body such as a spring within the solenoid as the first correction driver 66. Consequently, the movable portion 63 is held at the certain position, and the application direction of the laser light L1 from the shaking detection sensor 47 is set to be directed downward.

FIG. 4 is a perspective view illustrating an example of the second corrector 70. As illustrated in FIG. 4, the second corrector 70 includes a frame 71, a shaft 72, a movable portion 73, an inclination adjuster 74, and a second correction driver 76.

The frame 71 includes a metallic plate or the like and is fixed to the up-and-down driver 43 with bolts or the like. The frame 71 includes a band-shaped portion 71a extending downward. The shaft 72 protrudes from the band-shaped portion 71a. The shaft 72 has a central axis AX2 parallel to the Y direction. The movable portion 73 rotates in the θY direction around the shaft 72 with respect to the frame 71. The movable portion 73 includes a drive piece 73a and an application piece not illustrated. The drive piece 73a extends in the −X direction from the shaft 72 and to bend upward. The application piece (not illustrated) is located on the +X side with respect to the shaft 72. The drive piece 73a and the application piece are integrally rotatable in the θY direction around the central axis AX2. The drive piece 73a supports the look-down sensor 48 via a sensor attachment 74a described below.

The inclination adjuster 74 adjusts an inclination of the look-down sensor 48 with respect to the drive piece 73a. The inclination adjuster 74 includes the sensor attachment 74a, mounting screws 74b, and adjusting screws 74c. The sensor attachment 74a is mounted on the drive piece 73a with the mounting screws 74b. A lower end of the sensor attachment 74a is positioned to protrude below the shaft 72.

The adjusting screws 74c are mounted on the lower end of the sensor attachment 74a. The adjusting screws 74c fix the look-down sensor 48 to the sensor attachment 74a and adjust the inclination of the look-down sensor 48 in the θY direction with respect to the sensor attachment 74a. As illustrated in FIG. 4, in the present preferred embodiment, when viewed from the +X direction, for example, the adjusting screws 74c are located at two places, that is, a corner portion on the −Y side and the +Z side and a corner portion on the +Y side and on the −Z side of the look-down sensor 48. The two adjusting screws 74c are adjusted, such that the distance between the look-down sensor 48 and the sensor attachment 74a is adjusted, and thus the inclination of the look-down sensor 48 in the θY direction can be adjusted (such that the laser light L2 is applied to a certain direction).

The inclination adjuster 74 includes a rotation regulator (not illustrated). The rotation regulator regulates a rotational range of the movable portion 73 in the θY direction around the central axis AX2. As to this rotation regulator, when two screws are located, and the movable portion 73 rotates in the θY direction around the central axis AX2, for example, tips of the screws come into contact with a fixed portion to regulate the rotational range of the movable portion 73. The rotation regulator is set in advance in accordance with the angle of the up-and-down driver 43 inclining in the θY direction. The rotation regulator performs positioning at three points (a position at which the look-down sensor 48 is inclined to the −X side, the middle, and a position at which the look-down sensor 48 is inclined to the +X side) and can thus cope with both-side movement (lateral movement in the −X direction or the lateral movement in the +X direction) of the lateral mover 45.

The second correction driver 76 imparts a driving force in the X direction to the movable portion 73. The second correction driver 76 includes an actuator 76a and a transmitter 76b. For the actuator 76a, a solenoid or the like is used, for example. The transmitter 76b transmits the driving force of the actuator 76a to the drive piece 73a. The transmitter 76b may include an elastic member. The second correction driver 76 drives the drive piece 73a to cause a driving force in the X direction to act on the drive piece 73a. Consequently, the movable portion 73 rotates in the θY direction around the central axis AX2 to change the posture of the look-down sensor 48, and the application direction of the laser light L2 applied from the look-down sensor 48 changes in accordance with a rotational position of the movable portion 73.

As described above, the protruding amount in the X direction by the lateral mover 45 changes by the position of the transfer destination S. In accordance with the protruding amount by the lateral mover 45, the inclination of the up-and-down driver in the θY direction changes. Consequently, in the present preferred embodiment, when the up-and-down driver 43 is caused to protrude by the lateral mover 45, the controller 80 determines whether the application direction of the laser light L2 should be changed in accordance with the inclination of the up-and-down driver 43 in the θY direction. When the controller 80 determines that the application direction of the laser light L2 should be changed, the second correction driver 76 is driven by the adjuster 81 described below to rotate the movable portion 73 as described above, and thus the application direction of the laser light L2 applied from the look-down sensor 48 can be corrected. The controller 80 can correct the application direction of the laser light L2 from the look-down sensor 48 in accordance with the inclination of the up-and-down driver 43 simply by two kinds of control, that is, the drive piece 73a is driven or not driven by the second correction driver 76. When the second correction driver 76 does not drive the drive piece 73a, the transmitter 76b is held at a certain position by an elastic body such as a spring within the solenoid as the second correction driver 76. Consequently, the movable portion 73 is held at a certain position, and the application direction of the laser light L2 from the look-down sensor 48 is set to be directed to the certain direction.

The actuators 66a and 76a are not limited to the solenoids. A ball screw using an electric motor, a hydraulic or pneumatic cylinder, a linear motor, or the like may be used therefor, for example.

The controller 80 collectively controls an operation of the conveyance vehicle 100. The controller 80 includes the adjuster 81 and a storage 82. The adjuster 81 performs at least either adjustment of a laterally moved amount of the up-and-down driver 43 by the lateral mover 45 or adjustment of an orientation of the sensor 44 included in the up-and-down driver 43. The adjuster 81 performs the adjustment in accordance with the laterally moved amount of the up-and-down driver 43 by the lateral mover 45 and a lowered amount of the up-and-down stage 42 by the up-and-down driver 43.

That is, when the lateral mover 45 is caused to protrude in a lateral direction of the conveyance vehicle 100, bending occurs in the lateral mover 45 caused by the weight of the lateral mover 45 itself, the weight of the up-and-down driver 43, the weight of the up-and-down stage 42, the weight of the article FP, and the like. Due to this bending, the up-and-down stage 42 (the article FP) deviates from immediately above a placement surface of a transfer position at the transfer destination S, and even when the up-and-down stage 42 (the article FP) is lowered in this state, the article FP will be positioned so as to be spaced from the placement surface of the transfer position. The amount of the bending occurring in the lateral mover 45 varies by the weight of the article FP between when the article FP is located at the transfer destination S (at the time of unloading) and when the article FP at the transfer destination S is received (at the time of loading), and thus an appropriate laterally moved amount varies therebetween in order to locate the up-and-down driver 43 immediately above the transfer position. Consequently, to correct such deviation of the up-and-down driver 43, the laterally moved amount of the up-and-down driver 43 by the lateral mover 45 is required to be adjusted considering the bending in the lateral mover 45. Given these circumstances, the adjuster 81 performs the adjustment of the laterally moved amount of the up-and-down driver 43 by the lateral mover 45 in accordance with the laterally moved amount of the up-and-down driver 43 by the lateral mover 45 and the presence or absence of the article FP.

When performing the adjustment of the laterally moved amount of the up-and-down driver 43 by the lateral mover 45, as illustrated in FIG. 2, the adjuster 81 adjusts a drive amount of the drive apparatus 54 to adjust positions of the upper tier portion 51, the middle tier portion 52, and the lower tier portion 53 in the X direction. Through the bending of the lateral mover 45, a position of the up-and-down driver 43 in the X direction deviates to a position closer to the main body 40. Consequently, the adjuster 81 adjusts the position in the X direction of at least one of the upper tier portion 51, the middle tier portion 52, and the lower tier portion 53 to adjust the position of the up-and-down driver 43 supported on the lower tier portion 53. FIG. 2 illustrates a case in which from a state in which the lateral mover 45 was laterally moved in the −X direction, the lower tier portion 53 has been moved to the −X side by a certain value ΔX by the adjuster 81 to perform the adjustment as an example. When the lateral mover 45 is laterally moved in the +X direction, the lower tier portion 53 is moved by the certain value to the +X side by the adjuster 81 to perform the adjustment.

The adjuster 81 performs adjustment of the shaking detection sensor 47 and the look-down sensor 48 in accordance with the laterally moved amount of the up-and-down driver 43 by the lateral mover 45 and the lowered amount of the up-and-down stage 42 by the up-and-down driver 43. When being laterally moved by the lateral mover 45, the up-and-down stage 42 has been rotated around the θY axis. The shaking detection sensor 47 and the look-down sensor 48 also rotate around the θY axis along with the rotation of the up-and-down stage 42 around the θY axis. At this moment, even when the rotation of the shaking detection sensor 47 around the θY axis is small, when the lowered amount of the up-and-down stage 42 increases, the distance between the shaking detection sensor 47 and the up-and-down stage 42 increases, and thus even when the shaking (amplitude) of the up-and-down stage 42 is not that large, there is a possibility that the laser light L1 may miss the reflective plate 49, and the shaking detection sensor 47 may falsely detect that the up-and-down stage 42 is shaking beyond the permitted limit. In the look-down sensor 48, even when the rotation around the θY axis is small, when the lowered amount of the up-and-down stage 42 increases, the distance to a location at which an object such as an operator is to be detected increases, and thus there is a possibility that the laser light L2 applied from the look-down sensor 48 may miss the location, and the load port as the transfer destination S of the article FP or the like may falsely be detected as an obstacle, for example. Consequently, when the adjustment of the shaking detection sensor 47 is performed, as illustrated in FIG. 3, the adjuster 81 drives the actuator 66a of the first correction driver 66 to rotate the application direction of the laser light L1 in the θY direction and to correct the deviation of the application direction so as to be directed downward.

When the adjustment of the look-down sensor 48 is performed, as illustrated in FIG. 4, the adjuster 81 drives the actuator 76a of the second correction driver 76 to rotate the application direction of the laser light L2 in the θY direction and to correct the deviation of the application direction so as to be directed to the certain direction.

FIG. 5 is a diagram schematically illustrating an example of a detection operation by the shaking detection sensor 47. As illustrated in FIG. 5, the shaking detection sensor 47 applies the laser light L1 toward the reflective plate 49 and detects the laser light L1 reflected by the reflective plate 49. Although FIG. 5 illustrates the deviation of the laser light L1 with respect to the reflective plate 49 during the detection operation using the shaking detection sensor 47, the same holds true for the look-down sensor 48 about the deviation of the laser light L2 with respect to the detection place.

As illustrated in FIG. 5, the shaking detection sensor 47 applies the laser light L1 toward the reflective plate 49 to detect the laser light L1 reflected by the reflective plate 49.

The controller 80 detects a change amount in an optical axis position of the laser light L1 based on a detection result of the shaking detection sensor 47. Although FIG. 5 illustrates a state in which the gripper 42a is holding the article FP, the change amount in the optical axis position of the laser light L1 is also detected in a similar way in a state in which the gripper 42a is not holding the article FP. An application position of the laser light L1 on the reflective plate 49 changes by the bending of the lateral mover 45 and further also changes by the lowered amount of the up-and-down stage 42. The application position of the laser light L1 changes in the X direction as indicated by the arrow on the reflective plate 49. Consequently, when the laterally moved amount of the up-and-down driver 43 by the lateral mover 45 increases, and when the lowered amount of the up-and-down stage 42 increases, the application position of the laser light L1 departs from the reflective plate 49, and the detection by the shaking detection sensor 47 becomes unable to be performed.

FIG. 6 is a diagram illustrating a relation between a position of the up-and-down stage 42 and a change amount in the optical axis position when the gripper 42a is not holding the article FP. FIG. 7 is a diagram illustrating a relation between the position of the up-and-down stage 42 and the change amount in the optical axis position when the gripper 42a is holding the article FP. FIG. 6 and FIG. 7 represent results obtained by experimental results or simulations. The horizontal axis of FIG. 6 and FIG. 7 indicates the laterally moved amount of the up-and-down driver 43 by the lateral mover 45, whereas the vertical axis of FIG. 6 and FIG. 7 indicates the lowered amount of the up-and-down stage 42 by the up-and-down driver 43. The laterally moved amount indicates zero at the center in a right-and-left direction and indicates values up to a maximum value SL1 for the −X direction (the left direction in FIG. 5) from the center and values up to a maximum value SL2 for the +X direction (the right direction in FIG. 5) from the center. Although the maximum value SL1 and the maximum value SL2 are different from each other by reason of the mechanism of the lateral mover 45, a mechanism making them the same may be used. The lowered amount of the up-and-down stage 42 is zero at the upper end and is a maximum value DC at the lower end.

As illustrated in FIG. 6, when the gripper 42a is not holding the article FP, it has been confirmed that when the transfer destination S is present in an area A2, the up-and-down stage 42 is positioned in accordance with its height, and that the application position of the laser light L1 does not depart from the reflective plate 49 of the up-and-down stage 42, but it has been confirmed that when the laterally moved amount of the up-and-down driver 43 by the lateral mover 45 is large, and when the transfer destination S is present in an area A1 or A3, in which the lowered amount of the up-and-down stage 42 is large, the application position of the laser light L1 departs from the reflective plate 49. Note that the area A1 and the area A3 are different from each other in area shape in FIG. 6. Consequently, with the gripper 42a not holding the article FP, when the transfer destination S is present in the area A2, the application direction of the laser light L1 is not required to be adjusted, whereas when the transfer destination S is present in the area A1 or A3, the application direction of the laser light L1 is required to be adjusted.

As illustrated in FIG. 7, when the gripper 42a is holding the article FP, it has been confirmed that when the transfer destination S is present in an area A12, the application position of the laser light L1 does not depart from the reflective plate 49. The area A12 is narrower than the area A2 in FIG. 6. It has been confirmed that when the laterally moved amount of the up-and-down driver 43 by the lateral mover 45 is large, and when the transfer destination S is present in an area A11 or A13, in which the lowered amount of the up-and-down stage 42 is large, the application position of the laser light L1 departs from the reflective plate 49. Note that the area A11 and the area A13 are different from each other in area shape. In addition, the area A11 is wider in the X direction and the Z direction than the area A1 in FIG. 6, whereas the area A13 is wider in the X direction and the Z direction than the area A3 in FIG. 6. Consequently, when the gripper 42a is holding the article FP, when the transfer destination S is present in the area A12, the application direction of the laser light L1 is not required to be adjusted, whereas when the transfer destination S is present in the area A11 or A13, the application direction of the laser light L1 is required to be adjusted.

With the gripper 42a not holding the article FP, when the height of the up-and-down stage 42 is included in the area A1 or A3, the adjuster 81 of the controller 80 adjusts the application direction of the laser light L1. That is, the adjuster 81 performs three-stage adjustment including: a case in which the adjustment is not performed when the height of the up-and-down stage 42 is included in the area A2, a case in which the height of the up-and-down stage 42 is included in the area A1, and a case in which the height of the up-and-down stage 42 is included in the area A3. The adjuster 81 does not drive the actuator 66a (refer to FIG. 3) of the first correction driver 66 when the height of the up-and-down stage 42 is included in the area A2, drives the support 63b by the actuator 66a to incline the application direction of the laser light L1 to the +X side when the height of the up-and-down stage 42 is included in the area A1, and drives the support 63b by the actuator 66a to incline the application direction of the laser light L1 to the −X side when the height of the up-and-down stage 42 is included in the area A3.

When the gripper 42a is holding the article FP, when the height of the up-and-down stage 42 is included in the area A11 or A13, the adjuster 81 adjusts the application direction of the laser light L1. That is, the adjuster 81 performs three-stage adjustment including: a case in which the adjustment is not performed when the height of the up-and-down stage 42 is included in the area A12, a case in which the height of the up-and-down stage 42 is included in the area A11, and a case in which the height of the up-and-down stage 42 is included in the area A13. The adjuster 81 does not drive the support 63b by the actuator 66a (refer to FIG. 3) of the first correction driver 66 when the height of the up-and-down stage is included in the area A12, drives the support 63b by the actuator 66a to incline the application direction of the laser light L1 to the +X side when the height of the up-and-down stage 42 is included in the area A11, and drives the support 63b by the actuator 66a to incline the application direction of the laser light L1 to the −X side when the height of the up-and-down stage 42 is included in the area A13.

To compare FIG. 6 and FIG. 7 with each other, an area requiring the adjustment is wider when the gripper 42a is holding the article FP (refer to FIG. 7) than when the gripper 42a is not holding the article FP (refer to FIG. 6). That is, with the article FP being held, when the up-and-down driver 43 is laterally moved by the lateral mover 45, the weight of the article FP is added, and thus the bending of the lateral mover 45 increases, thus increasing a rotation amount of the up-and-down driver 43 around θY. Thus, with the article FP being held, the laser light L1 is more likely to miss the reflective plate 49 even when the lowered amount of the up-and-down stage 42 is smaller than when the article FP is not being held. The adjustment by the adjuster 81 is not limited to the three-stage one including the case in which the adjustment is not performed and may be two-stage or four-or-more-stage one.

That is, when the laterally moved amount is a value included in the area A1 or A3 (the area A11 or A13) indicated in FIG. 6 (FIG. 7) (a first specific value), if the lowered amount is a value included in the area A1 or A3 (the area A11 or A13) indicated in FIG. 6 (FIG. 7) (a value of a first threshold or more), the adjuster 81 performs either one or both of adjustment of the laterally moved amount and adjustment of the application direction of the laser light L1. On the other hand, when the laterally moved amount is the value included in the area A1 or A3 (the area A11 or A13) indicated in FIG. 6 (FIG. 7) (the first specific value), if the lowered amount is a value included in the area A2 (the area A12) indicated in FIG. 6 (FIG. 7) (a value less than the first threshold), the adjuster 81 does not perform either the adjustment of the laterally moved amount or the adjustment of the application direction of the laser light L1. The laterally moved amount and the lowered amount are based on data of a data table DT1 described below. Adjustment in accordance with the bending of the lateral mover 45 (a lateral movement adjustment amount and a lowering adjustment amount described below) is based on data of a data table DT2 described below.

When the lowered amount is a value included in the area A1 or A3 (the area A11 or A13) indicated in FIG. 6 (FIG. 7) (a second specific value), if the laterally moved amount is a value included in the area A1 or A3 (the area A11 or A13) indicated in FIG. 6 (FIG. 7) (a value of a second threshold or more), the adjuster 81 performs either one or both of the adjustment of the laterally moved amount and the adjustment of the application direction of the laser light L1. On the other hand, when the lowered amount is the value included in the area A1 or A3 (the area A11 or A13) indicated in FIG. 6 (FIG. 7) (the second specific value), if the laterally moved amount is a value included in the area A2 (the area A12) indicated in FIG. 6 (FIG. 7) (a value less than the second threshold), the adjuster 81 does not perform either the adjustment of the laterally moved amount or the adjustment of the application direction of the laser light L1. The laterally moved amount and the lowered amount are based on the data of the data table DT1 described below. The adjustment in accordance with the bending of the lateral mover 45 (the lateral movement adjustment amount and the lowering adjustment amount described below) is based on the data of the data table DT2 described below.

Figure 8B:
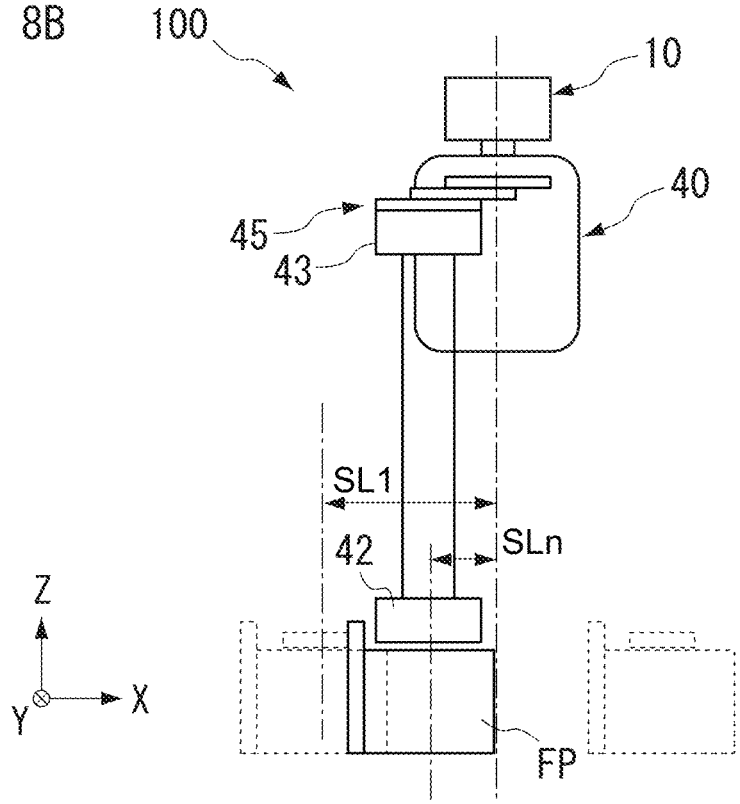

FIGS. 8A and 8B are diagrams illustrating the laterally moved amount of the up-and-down driver 43 by the lateral mover 45 when transfer is performed. FIG. 8A illustrates an example of a case in which the laterally moved amount is large, whereas FIG. 8B illustrates an example of a case in which the laterally moved amount is small. The laterally moved amount of the up-and-down driver 43 by the lateral mover 45 is determined by the position of the transfer destination S. As illustrated in FIG. 8A, when the transfer destination S is present immediately below the main body 40, the up-and-down stage 42 is caused to move up and down by the up-and-down driver 43 without performing the lateral movement of the up-and-down driver 43 by the lateral mover 45, such that the reception and delivery of the article FP can be performed. When the transfer destination S is present on the −X side, the reception and delivery of the article FP may be performed with the lateral mover 45 set to the laterally moved amount SL1, which is the maximum in the −X direction. When the transfer destination S is present on the +X side, the reception and delivery of the article FP may be performed with the lateral mover 45 set to the laterally moved amount SL2, which is the maximum in the +X direction. Both the maximum laterally moved amounts SL1 and SL2 are set with room enabling further lateral movement left.

As illustrated in FIG. 8A, when the up-and-down driver 43 is laterally moved with the laterally moved amount SL1 or SL2 by the lateral mover 45, the position of the up-and-down driver 43 deviates from a desired position in the X direction due to the bending of the lateral mover 45, and thus the adjustment of the laterally moved amount of the up-and-down driver 43 by the lateral mover 45 is required to be performed by the adjuster 81. Although FIG. 8A illustrates a case in which the up-and-down stage 42 (the gripper 42a) is holding the article FP (at the time of unloading), even when the up-and-down stage 42 is not holding the article FP (at the time of loading), when the up-and-down driver 43 is laterally moved with the laterally moved amount SL1 or SL2 by the lateral mover 45, the position of the up-and-down driver 43 deviates from a desired position in the X direction due to the bending of the lateral mover 45. Consequently, even when the up-and-down stage 42 is not holding the article FP, the adjustment of the laterally moved amount of the up-and-down driver 43 by the lateral mover 45 is required to be performed by the adjuster 81. Note that between when the up-and-down stage 42 is holding the article FP and when the up-and-down stage 42 is not holding the article FP, the bending amount of the lateral mover 45 varies, and an appropriate laterally moved amount by the lateral mover 45 varies. The adjuster 81 adjusts the laterally moved amount of the up-and-down driver 43 by the lateral mover 45 with different values between when the up-and-down stage 42 is holding the article FP (at the time of unloading) and when the up-and-down stage 42 is not holding the article FP (at the time of loading).

Depending on the position of the transfer destination S, the lateral mover 45 can perform the lateral movement with any laterally moved amount SLn in the +X direction or the −X direction. As illustrated in FIG. 8B, at the transfer destination S at a position with a distance of SLn in the −X direction from the center of the main body 40, the lateral movement is performed with the lateral mover 45 set to the laterally moved amount SLn in the −X direction. As described above, the bending amount of the lateral mover 45 changes by the laterally moved amount of the up-and-down driver 43 by the lateral mover 45, and the deviation of the up-and-down stage 42 in the X direction with respect to an area immediately above the transfer destination S changes. Like the aforementioned, the bending amount of the lateral mover 45 varies between when the up-and-down stage 42 is holding the article FP (at the time of unloading) and when the up-and-down stage 42 is not holding the article FP (at the time of loading). Consequently, the adjuster 81, in accordance with the laterally moved amount of the lateral mover 45, based on the presence or absence of the article FP in the up-and-down stage 42, adjusts the laterally moved amount of the up-and-down driver 43 by the lateral mover 45 for each case. Furthermore, after the lateral movement is performed by the lateral mover 45, the lowered amount of the up-and-down stage 42 varies depending on the height of the transfer destination S; thus, the application direction of the laser light L1 may depart from the reflective plate 49, and the application direction of the laser light L2 may depart from the certain direction, for example. In such cases, the adjuster 81 adjusts the application direction of the laser light L1 and the application direction of the laser light L2.

FIG. 9 is a diagram illustrating an example of transfer destinations of the article FP. As illustrated in FIG. 9, as the transfer destination S for the conveyance vehicle 100, eight different transfer destinations S1 to S8 are positioned in the X direction and the Z direction. Although FIG. 9 represents the transfer destinations S1 to S8 on one drawing for the sake of convenience, the transfer destinations S1 to S8 are positioned at different positions in the Y direction. Although FIG. 9 illustrates the eight transfer destinations S1 to S8, eight or more transfer destinations, for example, including a transfer destination between the transfer destinations S3 and S4, a transfer destination between the transfer destinations S6 and S7, or a transfer destination between the transfer destinations S3 and S6 may be set. In FIG. 9, the −X side is denoted by the left side, whereas the +X side is denoted by the right side. The transfer destination S1 is a left transfer destination. The transfer destination S2 is a right transfer destination. The transfer destination S3 is a left high place transfer destination. The transfer destination S4 is a high place transfer destination. The transfer destination S5 is a right high place transfer destination. The transfer destination S6 is a left low place transfer destination. The transfer destination S7 is a low place transfer destination. The transfer destination S8 is a right low place transfer destination.

FIG. 10 is a diagram illustrating an example in which the transfer destinations S1 to S8 of the article FP illustrated in FIG. 9 by areas. As illustrated in FIG. 10, when a transfer destination is included in the area indicated by S1, the transfer destination is regarded as the transfer destination S1. Similarly, when a transfer destination is included in the areas indicated by S2 to S8, the transfer destination is regarded as each of the transfer destinations S2 to S8. Information on such transfer destinations S1 to S8 is stored in the storage 82 (refer to FIG. 1) of the controller 80 as a data table, for example. FIG. 11 is a diagram illustrating an example of the data table DT1 about positions of the transfer destinations S1 to S8, the laterally moved amount of the up-and-down driver 43 by the lateral mover 45, and the lowered amount of the up-and-down stage 42 by the up-and-down driver 43.

The data table DT1 illustrated in FIG. 11 stores therein, for the eight transfer destinations S1 to S8 illustrated in FIG. 9 or FIG. 10, their respective positions (coordinate values: X1, Y1, Z1, and the like), laterally moved amounts SL1, SL2, SLX1, and SLX2 to receive and deliver the article FP from and to the transfer destinations S1 to S8, and lowered amounts H1, H2, and H3 of the up-and-down stage 42. Although the data table DT1 illustrates an example in which the transfer destinations S1 and S2, the transfer destinations S3, S4, and S5, and the transfer destinations S6, S7, and S8 are each at the same position (the same position Y1, Y2, or Y3) in the traveling direction of the conveyance vehicle 100, they may deviate from each other in the traveling direction of the conveyance vehicle 100.

SLX1 and SLX2 in the data table DT1 are values calculated by the laterally moved amount of the up-and-down driver 43 by the lateral mover 45 (the position of the transfer destination). The storage 82 stores therein a certain computational expression, and a lateral movement adjustment amount SLLX1 and the like are calculated by this computational expression. When the reception and delivery of the article FP are performed from and to any of the transfer destinations S1 to S8 by the conveyance vehicle 100, the controller 80 reads data of a target transfer destination from the data table DT1 and performs the lateral movement of the up-and-down driver 43 by the lateral mover 45 and the lowering of the up-and-down stage 42 by the up-and-down driver 43 to perform the reception and delivery of the article FP.

In this process, depending on the positions of the transfer destinations S1 to S8, at least either the adjustment of the laterally moved amount or the adjustment of the orientation of the sensor (the application direction of the laser light L1 of the shaking detection sensor 47 and the application direction of the laser light L2 of the look-down sensor 48) may be required. The adjuster 81 performs the adjustment of the laterally moved amount, adjustment of the lowered amount, and the adjustment of the orientation of the sensor in accordance with the positions of the transfer destinations S1 to S8 and the presence or absence of the article FP. The adjuster 81 performs the adjustment of the laterally moved amount, the adjustment of the lowered amount, and the adjustment of the orientation of the sensor from the data table DT2 stored in the storage 82 in accordance with the positions of the transfer destinations S1 to S8.

FIG. 12 is a diagram illustrating an example of the data table DT2 about the lateral movement adjustment amount and the adjustment of the orientation of the sensor. The adjuster 81 acquires the information on the transfer destinations S1 to S8 of the article FP from the data table DT1 of the storage 82 and performs either one or both of the adjustment of the laterally moved amount and the adjustment of the orientation of the sensor 44 required at a target transfer destination based on the data table DT2. The data table DT2 includes data about the lowering adjustment amount adjusting the lowered amount of the up-and-down stage 42. When bending occurs in the lateral mover 45, the spacing between the transfer destination S and the up-and-down stage 42 also changes. The adjuster 81 adjusts the lowered amounts H1, H2, and H3 of the up-and-down stage 42 acquired from the data table DT1 based on the data table DT2 in accordance with the laterally moved amount of the up-and-down driver 43 by the lateral mover 45.

The data table DT2 illustrated in FIG. 12 indicates that when the gripper 42a is holding the article at the transfer destination S1 (left STB) (in the case of "present"), the lateral movement adjustment amount (ΔX illustrated in FIG. 2) for the laterally moved amount SL1 by the lateral mover 45 is SLL1, that the lowering adjustment amount for the lowered amount H1 of the up-and-down stage 42 is H1A, and that the actuators 66a and 76a of the sensor 44 are off. The data table DT2 indicates that when the gripper 42a is not holding the article at the transfer destination S1 (in the case of "absent"), the lateral movement adjustment amount is SLL2, that the lowering adjustment amount is H1B, and that the actuators 66a and 76a of the sensor 44 are off.

The other transfer destinations are as indicated in the data table DT2. For the transfer destinations S4 and S7, the lateral movement of the up-and-down driver 43 by the lateral mover 45 is not performed. Thus, the bending of the lateral mover 45 does not occur, and the adjustment of the laterally moved amount, the adjustment of the lowered amount, and the adjustment of the orientation of the sensor by the adjuster 81 are not performed. SLLX1, SLLX2, SLRX1, and SLRX2 in the data table DT2 are values calculated by the laterally moved amount of the up-and-down driver 43 by the lateral mover 45. The storage 82 stores therein a certain computational expression, and the lateral movement adjustment amount SLLX1 and the like are calculated by this computational expression. ON(1) of the actuators 66a and 76a of the sensor 44 means that the application direction of the laser light L1 or the like is inclined to the +X side. ON(2) means that the application direction of the laser light L1 or the like to the −X side.

Thus, the details adjusted at the transfer destinations S1 to S2 are stored by the data table DT2 in advance, and thus a processing load of the controller 80 can be reduced. The lateral movement adjustment amounts SLL1, SLL2, SLR1, SLR2, SLLX1, SLLX2, SLRX1, and SLRX2 and the lowering adjustment amounts H1A, H1B, H1C, H1D, H2A, H2B, H2C, H2D, H3A, H3B, H3C, and H3D may be values determined by actually performing unloading or loading of the article FP for the transfer destinations S1 to S8 or be values determined by simulations. The data table DT2 is set including, for each conveyance vehicle 100, its own machine difference. That is, even with same laterally moved amount by the lateral mover 45, the bending amount of the lateral mover 45 varies by the rigidity or the like of each conveyance vehicle 100. Consequently, the data table DT2 set for each conveyance vehicle 100 is used, such that each conveyance vehicle 100 can accurately perform the unloading or loading of the article FP for the transfer destinations S1 to S8.

FIG. 13 is a diagram illustrating another example of a conveyance vehicle according to a preferred embodiment of the present invention. As illustrated in FIG. 13, in the processing room PR, upper and lower two-tier rails R are provided, and the conveyance vehicle 100 travels along each of the rails R. In this configuration, the laser light L2 applied from the look-down sensor 48 mounted on the upper conveyance vehicle 100 is inclined to the −X side by the bending of the lateral mover 45. In this state, the laser light L2 is applied to the lower conveyance vehicle 100, and there is a possibility that the look-down sensor 48 will falsely detect it to be abnormal, which may wastefully stop the operation of the conveyance vehicle 100.

In the present preferred embodiment, the adjuster 81 corrects the application direction of the laser light L2 applied from the look-down sensor 48 so as to be applied to the +X side in accordance with the laterally moved amount of the up-and-down driver 43 by the lateral mover 45. Consequently, the laser light L2 applied from the look-down sensor 48 is corrected to be an application direction L2a to depart from the lower conveyance vehicle 100, and false detection by the look-down sensor 48 can be prevented.

The following describes an operation of the conveyance vehicle 100 configured as described above. Operations of the elements of the conveyance vehicle 100 are performed by the controller 80. The controller 80 causes the traveling driver 10 to drive to cause the conveyance vehicle 100 to travel along the rail R. The controller 80 may cause the lateral mover 45 to protrude to the +X side or the −X side or does not necessarily cause the lateral mover 45 to protrude concurrently with the traveling of the conveyance vehicle 100. When the article FP grasped by the gripper 42a is located at the transfer destination S (refer to FIG. 1) or when the article FP at the transfer destination S is grasped by the gripper 42a, the controller 80 stops the conveyance vehicle 100 at a certain position corresponding to the transfer destination S. The stopping position of the conveyance vehicle 100 is immediately above the transfer destination S or a position deviated laterally from immediately above the transfer destination S, for example.

Next, when the transfer destination S laterally deviates from immediately below the rail, the controller 80 causes the up-and-down driver 43 to protrude to the side of the main body 40 by the lateral mover 45. The controller 80 has acquired the laterally moved amount of the up-and-down driver 43 by the lateral mover 45 in accordance with the transfer destination S in advance (refer to the data table DT1 in FIG. 11). The adjuster 81 adjusts at least either the laterally moved amount of the up-and-down driver 43 by the lateral mover 45 or the orientation of the sensor 44 based on the data table DT2 in FIG. 12 in accordance with the transfer destination S. The adjustment by the adjuster 81 may be either before performing the lateral movement of the up-and-down driver 43 by the lateral mover 45 or while the lateral movement of the up-and-down driver 43 by the lateral mover 45 is being performed.

With the adjustment by the adjuster 81, the up-and-down stage 42 is located immediately above the transfer destination S, and the application direction of the laser light L1 applied from the shaking detection sensor 47 is prevented from departing from the reflective plate 49, and the laser light L2 applied from the look-down sensor 48 is appropriately applied toward the vicinity of the transfer destination S. Furthermore, the lowered amount of the up-and-down stage 42 is adjusted by the adjuster 81. That the adjustment by the adjuster 81 varies between when the gripper 42a is grasping the article FP and when the gripper 42a is not grasping the article FP is as described above (refer to the data table DT2 in FIG. 12).

Next, the controller 80 lowers the up-and-down stage 42 to locate the article FP grasped by the gripper 42a at the transfer destination S or lowers the up-and-down stage 42 to grasp the article FP at the transfer destination S by the gripper 42a. Next, the controller 80 causes the up-and-down stage 42 to move up and then drives the lateral mover 45 to house the up-and-down stage 42 (the article FP) in the main body 40. After housing the up-and-down stage 42 in the main body 40, the controller 80 causes the traveling driver 10 to drive to cause the conveyance vehicle 100 to travel along the rail R.

Thus, according to the present preferred embodiment, in accordance with the laterally moved amount of the up-and-down driver 43 by the lateral mover 45 and the lowered amount of the up-and-down stage 42 by the up-and-down driver 43, adjustment of the laterally moved amount is performed to deliver the article FP to the transfer destination and to receive the article FP from the transfer destination, such that the article FP can accurately be received from and delivered to the transfer destination. In accordance with the laterally moved amount and the lowered amount of the up-and-down stage 42, adjustment of the orientation of the sensor 44 included in the up-and-down driver 43 is performed, such that the orientation of the sensor 44 can be directed to a target direction, and false detection can be prevented while ensuring an appropriate operation of the sensor 44.

Although the preferred embodiments have been described, the present invention is not limited to the above description and allows various modifications within a range not departing from the gist of the present invention. The corrector, for example, is by way of example, and a corrector having another configuration may be used. The sensor 44 is not limited to the shaking detection sensor 47 or the look-down sensor 48 and may be any sensor applying a detection wave having directivity.

One or more of the elements, features or characteristics described in the preferred embodiments and the like described above may be omitted. The elements, features or characteristics described in the preferred embodiments and the like described above can be combined with each other as appropriate. To the extent permitted by law, the disclosures of Japanese Patent Application No. 2018-234468 as a Japanese patent application and all the literature cited in the preferred embodiments and the like described above are hereby incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A conveyance vehicle comprising:
a traveler to travel along a track;
a main body coupled to the traveler to move by traveling of the traveler;
an up-and-down stage including a holder to hold an article and capable of moving up and down with respect to the main body;
an up-and-down driver to cause the up-and-down stage to move up and down by drawing out and winding up of a flexible hanging-and-holding structure;
a lateral mover to cause the up-and-down driver being cantilevered to protrude laterally of the main body; and
an adjuster to perform, in accordance with a laterally moved amount of the up-and-down driver by the lateral mover and a lowered amount of the up-and-down stage by the up-and-down driver, adjustment of an orientation of a sensor included in the up-and-down driver to deliver the article to a transfer destination or to receive the article from the transfer destination.

2. The conveyance vehicle according to claim 1, wherein
the sensor is configured to apply a detection wave having directivity toward a predetermined position; and
the adjuster is configured to adjust the orientation of the sensor so as to correct a deviation of an application direction of the detection wave.

3. The conveyance vehicle according to claim 2, wherein
the sensor includes an actuator to change the application direction of the detection wave; and
the adjuster is configured to drive the actuator to correct the deviation of the application direction of the detection wave.

4. The conveyance vehicle according to claim 1, wherein
the main body includes a storage to store therein a data table relating to the laterally moved amount of the up-and-down driver by the lateral mover and the lowered amount to the transfer destination, for each of a plurality of the transfer destinations from and to which the article is received and delivered; and
the adjuster is configured to acquire information on the transfer destinations of the article from the data table stored in the storage and, based on the information, perform the adjustment of the orientation of the sensor included in the up-and-down driver.

5. The conveyance vehicle according to claim 4, wherein when the laterally moved amount indicated by the data table is a first specific value, the adjuster is configured to:
not perform the adjustment of the orientation of the sensor included in the up-and-down driver when the lowered amount indicated by the data table is less than a first threshold; and
perform the adjustment of the orientation of the sensor included in the up-and-down driver when the lowered amount indicated by the data table is equal to the first threshold or more.

6. The conveyance vehicle according to claim 4, wherein when the lowered amount indicated by the data table is a second specific value, the adjuster is configured to:
not perform the adjustment of the orientation of the sensor included in the up-and-down driver when the laterally moved amount indicated by the data table is less than a second threshold; and
perform the adjustment of the orientation of the sensor included in the up-and-down driver when the laterally moved amount indicated by the data table is equal to the second threshold or more.

* * * * *